(12) United States Patent
Cho et al.

(10) Patent No.: US 9,312,322 B2
(45) Date of Patent: Apr. 12, 2016

(54) ORGANIC LIGHT EMITTING DIODE DISPLAY DEVICE AND METHOD OF FABRICATING THE SAME

(71) Applicant: LG DISPLAY CO., LTD., Seoul (KR)

(72) Inventors: KiSul Cho, Gumi-si (KR); JinChae Jeon, Daegu (KR)

(73) Assignee: LG Display Co., Ltd., Seoul (KR)

( * ) Notice: Subject to any disclaimer, the term of this patent is extended or adjusted under 35 U.S.C. 154(b) by 169 days.

(21) Appl. No.: 13/720,651

(22) Filed: Dec. 19, 2012

(65) Prior Publication Data

US 2014/0042397 A1    Feb. 13, 2014

(30) Foreign Application Priority Data

Aug. 10, 2012  (KR) .................. 10-2012-0087980

(51) Int. Cl.
  *H01L 27/32*     (2006.01)
  *H01L 51/00*     (2006.01)
  *H01L 27/12*     (2006.01)

(52) U.S. Cl.
  CPC ........ *H01L 27/3272* (2013.01); *H01L 27/1288* (2013.01); *H01L 27/322* (2013.01); *H01L 27/3244* (2013.01); *H01L 51/0001* (2013.01)

(58) Field of Classification Search
  CPC .............. H01L 27/1214; H01L 27/322; H01L 27/3244; H01L 51/5253; H01L 2227/323; H01L 27/3272; H01L 27/1259; H01L 27/3225; H01L 29/4908; H01L 2924/12044
  USPC .......... 438/158, 29, 160, 159; 257/40, 82, 84, 257/88, 184, 257
  See application file for complete search history.

(56) References Cited

U.S. PATENT DOCUMENTS

| | | | |
|---|---|---|---|
| 7,557,382 B2* | 7/2009 | Koh et al. ........................ | 257/82 |
| 8,860,303 B2* | 10/2014 | Kim et al. ..................... | 313/506 |
| 2006/0050192 A1* | 3/2006 | Cho et al. ........................ | 349/42 |
| 2007/0249122 A1 | 10/2007 | Seo et al. | |
| 2009/0302750 A1* | 12/2009 | Jun et al. ....................... | 313/504 |
| 2011/0049523 A1 | 3/2011 | Choi et al. | |
| 2013/0168648 A1* | 7/2013 | Jeong .............................. | 257/40 |
| 2013/0313530 A1* | 11/2013 | Seo et al. ........................ | 257/40 |

FOREIGN PATENT DOCUMENTS

| | | |
|---|---|---|
| CN | 1551690 A | 12/2004 |
| CN | 1610110 A | 4/2005 |
| CN | 101470295 A | 7/2009 |
| CN | 102468232 A | 5/2012 |
| JP | 2007-149693 A | 6/2007 |
| KR | 10-2011-0021259 A | 3/2011 |
| KR | 10-2012-0072949 A | 7/2012 |

* cited by examiner

Primary Examiner — Eva Y Montalvo
Assistant Examiner — David Goodwin
(74) Attorney, Agent, or Firm — Birch, Stewart, Kolasch & Birch, LLP

(57) ABSTRACT

An organic light emitting diode (OLED) display device in which an oxide-based semiconductor is used as an active layer of a TFT and the fabrication method thereof are provided. In the OLED display device, the active layer is formed at an upper portion of the gate electrode and a source electrode is patterned to completely cover the channel region of the active layer, to block light introduced from upper and lower portions of the active layer, thereby improving reliability of the oxide TFT.

14 Claims, 13 Drawing Sheets

ORGANIC LIGHT EMITTING DIODE DISPLAY DEVICE AND METHOD OF FABRICATING THE SAME

The present disclosure relates to subject matter contained in priority Korean Application No. 10-2012-0087980, filed on Aug. 10, 2012, which is herein expressly incorporated by reference in its entirety.

BACKGROUND OF THE INVENTION

1. Field of the Invention

The present invention relates to organic light emitting diode (OLED) display device and a method of fabricating the same and, more particularly, to an OLED display device in which OLED pixels are patterned through a photolithography process, and a method of fabricating the same.

2. Description of the Related Art

Recently, as interest in information displays has been on the rise and demand for the use of portable information media has been increased, lightweight flat panel displays (FPDs) substituting cathode ray tubes (CRTs) as existing display devices have been actively researched and commercialized.

In the FPD fields, a liquid crystal display (LCD) device, which is lighter and consumes less power, has been spotlighted; however, since an LCD device is a light receiving device, rather than a light emitting device, having shortcomings of brightness, contrast ratio, and a viewing angle, and the like, so a development of a new display device that may overcome such drawbacks has been actively made.

An LED display device, one of new display devices, is a self-luminous type device, which thus is excellent in a viewing angle and contrast ratio, is lighter and thinner because it does not need a backlight, and is advantageous in terms of power consumption, relative to an LCD device. In addition, an OLED display device can be driven by a DC and at a low voltage, has a fast response speed, and is especially advantageous in terms of fabrication costs.

Unlike an LCD device or a plasma display panel (PDP), deposition and encapsulation are the whole of a fabrication process of an OLED display device, so the fabrication process is very simple. Also, when the OLED display device is driven according to an active matrix scheme in which each pixel has a thin film transistor (TFT) as a switching element, the same luminance can be obtained although a low current is applied, so, advantageously, the OLED display device consumes low power, has a high pitch (or high definition or high resolution), and can be increased in size.

Hereinafter, a basic structure and operational characteristics of an OLED display device will be described in detail with reference to the accompanying drawings.

FIG. 1 is a diagram illustrating a light emission principle of a related art OLED display device.

As shown in FIG. 1, a related art OLED display device includes an OLED. The OLED includes organic compound layers 301, 30b, 30c, 30d, and 30e formed between an anode 18 as a pixel electrode and a cathode 28 as a common electrode.

Here, the organic compound layers 30a, 30b, 30c, 30d, and 30e include a hole injection layer 30a, a hole transport layer 30b, an emission layer 30c, an electron transport layer 30d, and an electron injection layer 30e.

When a driving voltage is applied to the anode 18 and the cathode 28, holes which have passed through the hole transport layer 30b and electrons which have passed through the electron transport layer 30e move to the light emission layer 30c to form excitons, and as a result, the light emission layer 30c emits visible light.

In the OLED display device, the pixels each having the OLED having the foregoing structure are arranged in a matrix form and selectively controlled by a data voltage and a scan voltage to display an image.

The OLED display device is divided into a passive matrix type OLED display device and an active matrix type display device using TFTs as switching elements. Among them, in the active matrix type OLED display device, TFTs as active elements are selectively turned on to select pixels and emitting of pixels is maintained by a voltage maintained in a storage capacitor.

FIG. 2 is an equivalent circuit diagram of a pixel in a related art OLED display device. Namely, FIG. 2 illustrates an example of an equivalent circuit diagram of a pixel having a related art 2T1C (including two transistors and one capacitor) in an active matrix type OLED display device.

Referring to FIG. 2, a pixel of an active matrix type OLED display device includes an OLED, a data line DL and a gate line GL crossing each other, a switching TFT SW, a driving TFT DR, and a storage capacitor Cst.

Here, the switching TFT SW is turned on in response to a scan pulse from the gate line GL to conduct a current path between a source electrode and a drain electrode thereof. During an ON-time period of the switching TFT SW, a data voltage from the data line DL is applied to a gate electrode of the driving TFT DR and the storage capacitor Cst by way of the source electrode and drain electrode of the switching TFT SW.

Here, the driving TFT DR controls a current flowing in the OLED according to the data voltage applied to the gate electrode thereof. The storage capacitor Cst stores a voltage between the data voltage and a low potential power source voltage VSS and uniformly maintains it during one frame period.

Recently, interest in a middle and large display market, beyond a small display panel for portable devices, has increased and a white organic light emitting diode (W-OLED) has come to prominence as a technique satisfying such market demand. A W-OLED uses color filters to implement red, green, and blue colors. Also, in order to achieve a large OLED display device, the development of a transistor which stably operates and has durability by securing constant current characteristics, as a driving thin film transistor (TFT) has been requested.

Thus, an oxide TFT in which an active layer is formed of an oxide semiconductor has been developed. Hereinafter, a structure of a related art W-OLED display device employing an oxide TFT will be described in detail.

FIG. 3 is a cross-sectional view schematically illustrating a structure of a related art W-OLED display device. The related art W-OLED display device illustrated in FIG. 3 has a color filter on TFT (COT) structure in which a color filter is formed on a lower array substrate.

Referring to FIG. 3, the W-OLED display device having the COT structure implement red, green, and blue colors by using a color filter 17 formed on an array substrate 10. In detail, the array substrate includes a plurality of gate lines (not shown) and data lines (not shown) defining a plurality of pixel regions, TFTs formed at crossings of the gate lines and the data lines, the color filter 17 and a pixel electrode 18 formed in each of the pixel regions.

The TFT includes a gate electrode 21 connected to the gate line, a source electrode 22 connected to the data line, and a drain electrode 23 connected to the pixel electrode 18. Also, the TFT includes a gate insulating layer 15a for insulating the gate electrode 21 and the source and drain electrodes 22 and 23, and an active layer 24 made of an oxide semiconductor and forming a conductive channel between the source electrode 22 and the drain electrode 23 by a gate voltage supplied to the gate electrode 21.

An oxide semiconductor used in the oxide TFT has a weak bonding structure. Thus, in order to prevent damage to a back channel region, an etch stopper 25 is required to be additionally formed on the active layer 24, having shortcomings in that a corresponding process is additionally performed. In this case, the etch stopper 25 is applied to secure stability of the back channel in a bottom gate structure.

A protective film 15b is formed at an upper portion of the TFT configured as described above, and the red, green, and blue color filter 17 is formed on the protective film 15b of the pixel region. An overcoat layer 15c is formed on a front surface of the array substrate 10 on which the color filter 17 is formed, in order to compensate for a step between the color filter 17 and the TFT.

The pixel electrode 18 is formed on the overcoat layer 15c. In this case, the pixel electrode 18 is electrically connected to the drain electrode 23 through a contact hole.

Here, although not shown, a partition is formed on the array substrate 10 on which the pixel electrode 18 is formed, and a white organic light emitting layer is formed on the array substrate 10 on which the partition is formed. A common electrode as a cathode is formed on the organic light emitting layer.

In the related art W-OLED display device having the etch stopper configured as described above, in order to form up to the pixel electrode, at least 11 masks such as a gate wiring (i.e., the gate electrode and the gate line), the active layer, the etch stopper, a gate contact, a data wiring (i.e., the source electrode, the drain electrode, and the data line), the protective layer, the red, green, and blue color filter, the overcoat layer, the pixel electrode, and the like, are required, and parasitic capacitance is large due to interlayer superposition.

Also, as mentioned above, the etch stopper is applied in order to secure stability of the back channel, but it is difficult to secure reliability characteristics due to light introduced from upper and lower portions of the active layer, and although a high temperature thermal treatment is required to improve reliability, it is difficult to apply copper (Cu) as a gate wiring.

For reference, in the related art OLED display device, two or more TFTs including a driving TFT and a switching TFT are present in a single pixel region, and the foregoing gate contact is required in order to connect the gate electrode of the driving TFT and the drain electrode of the switching TFT.

SUMMARY OF THE INVENTION

An aspect of the present invention provides an organic light emitting diode (OLED) display device in which light introduced from upper and lower sides of an active layer is blocked to improve reliability of an oxide thin film transistor (TFT) and a fabrication process is simplified, and a fabrication method thereof.

According to an aspect of the present invention, there is provided an organic light emitting diode (OLED) display device including: a gate line formed on an array substrate and including a gate electrode; an active layer formed on the gate line with a gate insulating layer interposed therebetween and formed of an amorphous zinc oxide semiconductor; a first source electrode and a drain electrode formed on a source region and a drain region of the active layer, respectively; an interlayer insulating layer formed on the array substrate with the first source electrode and drain electrode formed thereon; red, green, and blue color filters formed on the array substrate with the interlayer insulating layer formed thereon and covering a pixel region in which an image is displayed; a first protective layer formed on the array substrate with the color filters formed thereon and including a first contact hole and a second contact hole exposing the first source electrode and the drain electrode, respectively; a second source electrode and a second drain electrode formed on the first protective layer and electrically connected to the first source electrode and the first drain electrode through the first contact hole and the second contact hole, respectively; a second protective layer formed on the array substrate with the second source electrode and the drain electrode formed thereon and having a third contact hole exposing the second drain electrode; a pixel electrode formed on the second protective layer and electrically connected to the second drain electrode through the third contact hole; a partition formed on the array substrate with the pixel electrode formed thereon and partitioning the pixel region; a white organic light emitting layer formed on the array substrate with the partition formed thereon; and a common electrode formed on the organic light emitting layer, wherein the gate electrode is formed to cover a lower portion of the active layer and the source electrode is formed to extend to cover the channel region of the active layer from above.

The color filter may be formed to cover a TFT region as well as the pixel region.

The OLED display device may further include: an overcoat layer formed to cover the pixel region in which the color filters are formed and the TFT region.

According to another aspect of the present invention, there is provided a method for fabricating an organic light emitting diode (OLED) display device, including: forming a first conductive layer, a gate insulating layer, and an active layer on an array substrate; forming a first source electrode and a drain electrode formed of a second conductive layer on a source region and a drain region of the active layer, and forming a gate line including a gate electrode formed of the first conductive layer under the active layer; forming an interlayer insulating layer on the array substrate with the first source electrode, the drain electrode, the gate electrode, and the gate line formed thereon; forming red, green, and blue color filters to cover a pixel region in which an image is displayed; forming a first protective layer on the array substrate with the color filters formed thereon, the protective layer having a first contact hole and a second contact hole exposing the first source electrode and the drain electrode, respectively; forming a second source electrode and a second drain electrode electrically connected to the first source electrode and the first drain electrode through the first contact hole and the second contact hole, respectively, the second source electrode and the second drain electrode being formed of a third conductive layer on the first protective layer; forming a second protective layer on the array substrate with the second source electrode and the drain electrode formed thereon, the second protective layer including a third contact hole exposing the second drain electrode; forming a pixel electrode electrically connected to the second drain electrode through the third contact hole, the pixel electrode being formed of a fourth conductive layer on the second protective layer; forming a partition partitioning the pixel region on the array substrate with the pixel electrode formed thereon; forming a white organic light emitting layer on the array substrate with the partition formed thereon; and forming a common electrode on the organic light emitting layer.

The first conductive layer may be made of an opaque low resistance conductive material such as molybdenum, a molybdenum alloy such as molybdenum-titanium, chromium, tantalum, or titanium.

The active layer may be made of an amorphous zinc oxide semiconductor.

The second conductive layer may be formed to have a tri-layer structure by applying molybdenum-titanium, or the like, as a barrier layer to upper and lower portions of a low resistance conductive material such as copper, or the like, as a main wiring.

The first source electrode, the drain electrode, the gate electrode, and the gate line may be formed through the same masking process.

When the gate electrode and the gate line are formed, a first data pad line and a first gate pad line formed of the first conductive layer may be formed in a pad part of the array substrate.

When the first source electrode and the drain electrode are formed, a second data pad line and a second gate pad line may be formed of the second conductive layer on the first data pad line and the first gate pad line.

When the second protective layer is formed, the second protective layer, the first protective layer, and the interlayer insulating layer may be selectively patterned to form a fourth contact hole and a fifth contact hole, exposing the second data pad line and the second gate pad line, respectively, in the pad part of the array substrate.

When the pixel electrode is formed, a data pad electrode and a gate pad electrode electrically connected to the second data pad line and the second gate pad line through the fourth contact hole and the fifth contact hole may be formed in the pad part of the array substrate.

When the gate electrode and the gate line are formed, a first gate pad line formed of the first conductive layer may be formed in the pad part of the array substrate.

When the first source electrode and the drain electrode are formed, a second gate pad line formed of the second conductive layer may be formed on the first gate pad line.

When the second source electrode and the drain electrode are formed, a data pad line formed of the third conductive layer may be formed in the pad part of the array substrate.

When the second protective layer is formed, the second protective layer, the first protective layer, and the interlayer insulating layer may be selectively patterned to form a fourth contact hole and a fifth contact hole, exposing the data pad line and the second gate pad line, respectively, in the pad part of the array substrate.

When the pixel electrode is formed, a data pad electrode and a gate pad electrode electrically connected to the data pad line and the second gate pad line through the fourth contact hole and the fifth contact hole, respectively, may be formed in the pad part of the array substrate.

The color filters may be formed to cover the TFT region as well as the pixel region.

The method may further include: forming an overcoat layer to cover the pixel region in which the color filters are formed and the TFT region, after the color filters are formed.

The gate electrode may be formed to cover a lower portion of the active layer, and the second source electrode may be formed to extend to cover a channel region of the active layer from above.

The third conductive layer may be formed to have a dual-layer structure including a low resistance conductive material such as copper, or the like, as a main wiring and a molybdenum-titanium as an underlying barrier layer.

As described, in the case of the OLED display device in which an oxide-based semiconductor is used as an active layer of a TFT and the fabrication method thereof according to embodiments of the present invention, since the active layer is formed at an upper portion of the gate electrode and the source electrode is patterned to completely cover the channel region of the active layer, light introduced from upper and lower portions of the active layer can be blocked. As a result, reliability of the oxide TFT can be improved.

Also, in the case of the OLED display device and the fabrication method thereof according to embodiments of the present invention, since an etch stopper is eliminated, the process is simplified and, since a gap is formed by forming the color filters or the overcoat layer in the interlayer superposed portion, parasitic capacitance can be minimized.

In this case, a high temperature thermal treatment is performed in advance during a first masking process to improve reliability of the oxide semiconductor, and by applying copper to form the gate wiring during a second masking process, the present invention can be applied to a large ultra definition (UD) display device, or the like.

The foregoing and other objects, features, aspects and advantages of the present invention will become more apparent from the following detailed description of the present invention when taken in conjunction with the accompanying drawings.

DETAILED DESCRIPTION OF THE INVENTION

Hereinafter, an organic light emitting diode (OLED) display device and a method for fabricating the same according to embodiments of the present invention will be described in detail with reference to the accompanying drawings such that they can be easily implemented by a person skilled in the art to which the present invention pertains. The present invention may be implemented in various forms without being limited to the embodiments described herein.

Figure 1:
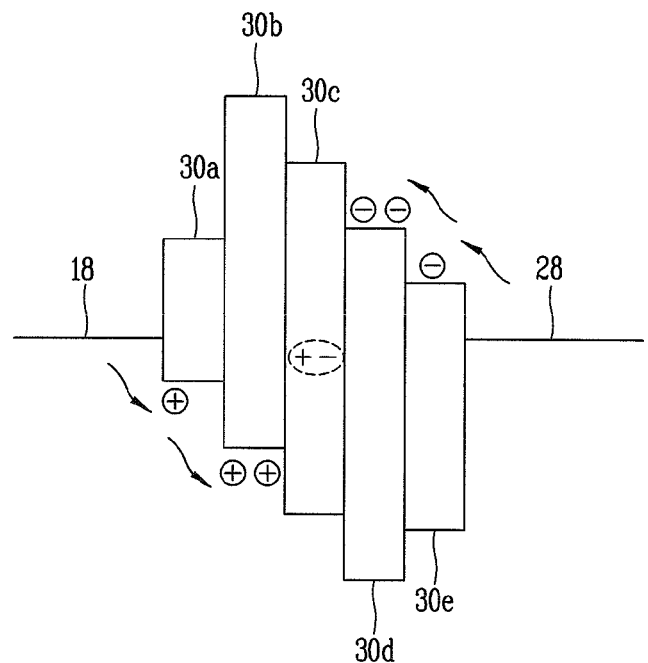
FIG. 1 is a diagram illustrating a light emission principle of a related art organic light emitting diode (OLED) display device.
Figure 2:
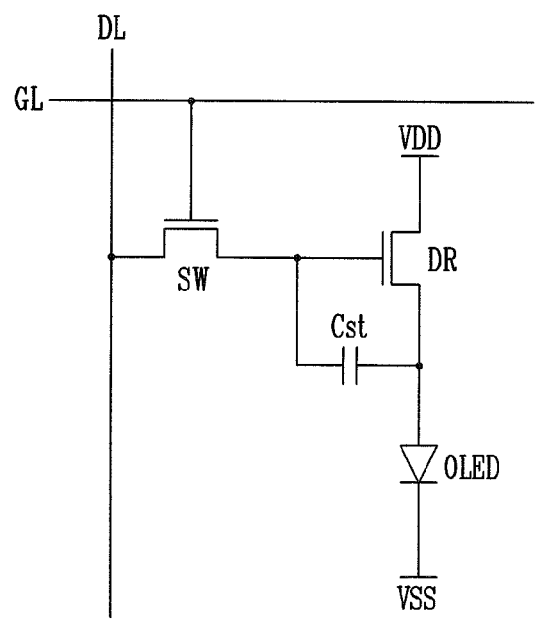
FIG. 2 is an equivalent circuit diagram of a pixel in a related art OLED display device.
Figure 3:
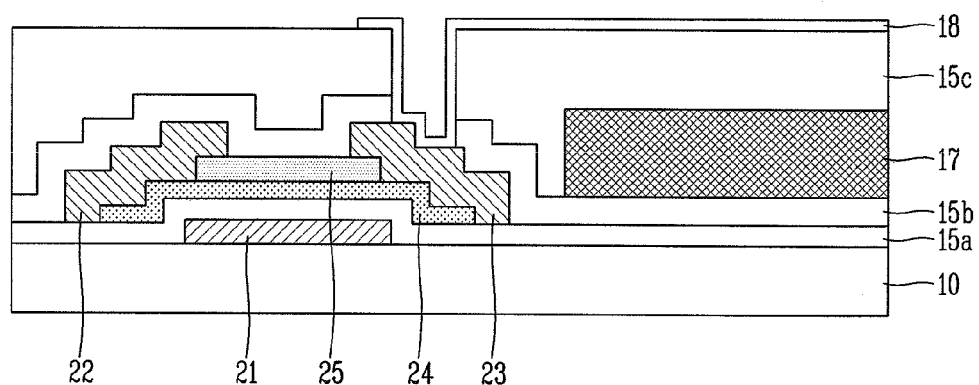
FIG. 3 is a cross-sectional view schematically illustrating a structure of a related art white (W)-OLED display device.
Figure 4:
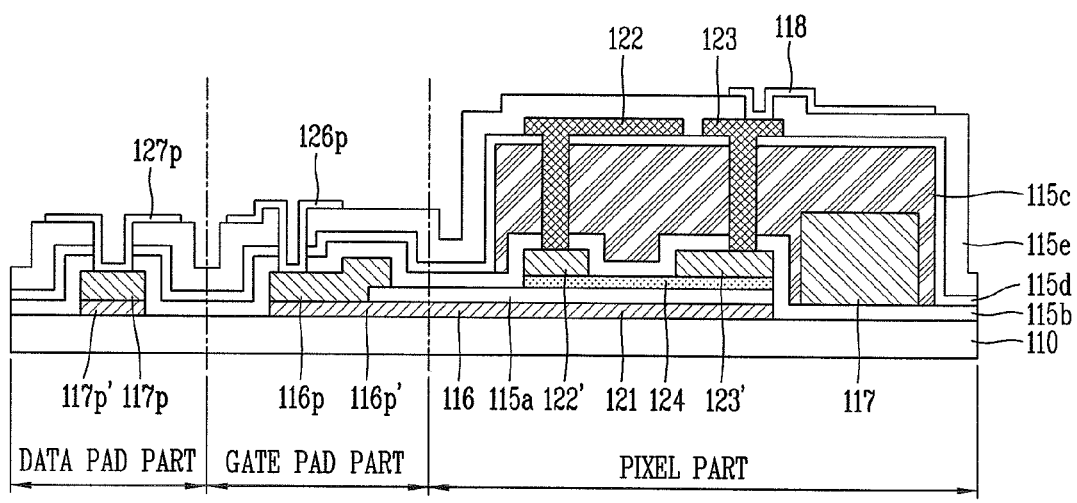
FIG. 4 is a cross-sectional view schematically illustrating a structure of an OLED display device according to the first embodiment of the present invention.

FIG. 4 is a cross-sectional view schematically illustrating a structure of an OLED display device according to the first embodiment of the present invention, in which a white organic light emitting diode (W-OLED) display device having a color filter on TFT (COT) structure in which color filters are formed on a lower array substrate is illustrated as an example.

Here, a single pixel including a pixel part, a data pad part, and a gate pad part is illustrated in the drawing, and N number of gate lines and M number of data lines cross to form M×N number of pixels in an actual OLED device, but for the description purpose, a single pixel is illustrated in the drawings.

As illustrated, in the W-OLED display device according to the first embodiment of the present invention, a gate line 116 including a gate electrode 121, a first data pad line 117p', and a first gate pad line 116p' are formed on an array substrate 110 made of an insulating material such as transparent glass, plastic, or the like.

The gate line 116 extends in a horizontal direction and transfers a gate signal. Here, the gate line 116 is connected to the first gate pad line 116p' for a connection to a different layer or an external driving circuit (not shown), and the gate electrode 121 may form a portion of the gate line 116. When a gate driving circuit generating a gate signal is integrated on the array substrate 110, the gate line 116 may extend to be directly connected to the gate driving circuit.

A gate insulating layer 115a formed of a silicon nitride layer SiNx, a silicon oxide layer $SiO_2$, or the like, is formed on the gate line 116 including the gate electrode 121 and the predetermined first gate pad line 116p'.

An active layer 124 formed of an oxide semiconductor is formed on the gate insulating layer 115a, and in this case, the active layer 124 is positioned on the gate electrode 121 such that a lower portion thereof is completely covered by the gate electrode 121.

Here, in the first embodiment of the present invention, for example, the active layer 124 is formed of the oxide semiconductor, but the present invention is not limited thereto and the active layer 124 may be formed of hydrogenated amorphous silicon or polycrystalline silicon.

The oxide TFT employing the oxide semiconductor as the active layer 124 has high mobility and can be fabricated at a low temperature, thus advantageously being used in a transparent electronic circuit.

Also, unlike the existing amorphous silicon TFT, the oxide TFT is fabricated to have a structure without an n+ layer, advantageously simplifying the process.

For example, in the oxide TFT according to the first embodiment of the present invention, since the active layer 124 is formed by using an amorphous zinc oxide (ZnO) semiconductor, high mobility and constant current test conditions are satisfied and uniform characteristics are secured to be applicable to a large display.

Namely, the zinc oxide is a material capable of implementing three types of qualities such as conductivity, semiconductor characteristics, and resistivity according to the content of oxygen, and an oxide TFT employing an amorphous zinc oxide semiconductor material as the active layer 124 may be applied to a large display.

Also, recently, a huge interest and activities are concentrated on transparent electronic circuits, and here, since the oxide TFT employing the amorphous zinc oxide semiconductor material as the active layer 124 has high mobility and is fabricated at a low temperature, it is advantageously used in the transparent electronic circuits.

In particular, in the oxide TFT according to the first embodiment of the present invention, the active layer is formed of an a-IGZO containing heavy metal such as indium (In) and gallium (Ga) in the ZnO.

The a-IGZO semiconductor is so transparent as to allow a visible light to pass therethrough, and also, since the oxide TFT formed of the a-IGZO semiconductor has mobility of 1~100 $cm^2/Vs$, exhibiting high mobility characteristics in comparison to an amorphous silicon TFT. Also, the a-IGZO semiconductor can be processed at a low temperature, it can produce a light, flexible product.

In addition, the oxide TFT formed of the a-IGZO semiconductor has characteristics similar to that of the amorphous silicon TFT, and thus, it has a component structure as simple as that of the amorphous silicon TFT and can be applied to a large flat panel display device.

A first source electrode 122' and a first drain electrode 123' are formed on a source region and a drain region of the active layer 124, respectively, and a second data pad line 117p and a second gate pad line 116p are formed on the first data pad line 117p' and the first gate pad line 116p', respectively.

Here, the first source electrode 122', the first drain electrode 123', the second data pad line 117p, and the second gate pad line 116p may use a low-resistance conductive material such as copper (Cu), or the like, as a main wiring, and in this case, they may be formed to have a tri-layer structure employing a molybdenum-titanium (MoTi), or the like, as a barrier layer to upper and lower portions thereof. However, the present invention is not limited thereto.

An interlayer insulating layer 115b formed of a silicon nitride layer, a silicon oxide layer, or the like, is formed on the first source electrode 122', the first drain electrode 123', the second data pad line 117p, and the second gate pad line 116p.

Here, in the W-OLED display device according to the first embodiment of the present invention, red, green, and blue color filters 117 are formed on the interlayer insulating layer 115b of the pixel region in which an image is displayed.

An overcoat layer 115c made of photoacryl, or the like, is formed to cover the pixel region in which the color filters 117 are formed and the TFT region.

A first protective layer 115d formed of a silicon nitride layer, a silicon oxide layer, or the like, is formed on the entire surface of the array substrate 110 with the overcoat layer 115 formed thereon.

In this case, certain regions of the first protective layer 115d are removed to form a first contact hole and a second contact hole exposing portions of the first source electrode 122' and the first drain electrode 123'.

A data line (not shown) is formed on the first protective layer 115d, and a second source electrode 122 and a second drain electrode 123 electrically connected to the first source electrode 122' and the first drain electrode 123' through the first contact hole and the second contact hole, respectively, are formed on the first protective layer 115d.

Here, the second source electrode 122 is formed to extend to completely cover a channel region of the active layer 124 from above, blocking light introduced from upper and lower portions of the active layer 124 together with the lower gate electrode 121, to improve reliability of the oxide TFT.

The data line transfers a data signal and extends in a vertical direction to cross the gate line 116. Here, the data line includes an end portion (not shown) having a large area for a connection between the second source electrode 122 extending toward the gate electrode 121 and a different layer or an external driving circuit (not shown). When a data driving circuit generating a data signal is integrated on the array substrate 110, the data line may extend to be directly connected to the data driving circuit.

Here, the data line, the second source electrode 122, and the second drain electrode 123 may use a low-resistance conductive material such as copper (Cu), or the like, as a main wiring, and in this case, the data line, the second source electrode 122, and the second drain electrode 123 may be formed to have a dual-layer structure employing MoTi, or the like, as a barrier layer thereunder. However, the present invention is not limited thereto.

A certain second protective layer 115e is formed on the array substrate 110 with the data line, the second source electrode 122, and the second drain electrode 123 formed thereon.

Here, a third contact hole exposing a portion of the second drain electrode 123 is formed in the second protective layer 115e of the pixel part, and a fourth contact hole and a fifth contact hole exposing portions of the second data pad line 117p and the second gate pad line 116p, respectively, may be formed in the second protective layer 115e, the first protective layer 115d, and the interlayer insulating layer 115b of the pad part.

A pixel electrode 118, a data pad electrode 127p, and a gate pad electrode 126p are formed on the second protective layer 115e. The pixel electrode 118, the data pad electrode 127p, and the gate pad electrode 126p may be made of a transparent conductive material such as indium tin oxide (ITO), indium zinc oxide (IZO), or the like, or a reflective conductive material such as aluminum, silver, or an alloy thereof, or the like.

Here, the pixel electrode 118 as a positive electrode is electrically connected to the second drain electrode 123 through the third contact hole, and the data pad electrode 127p and the gate pad electrode 126p are electrically connected to the second data pad line 117p and the second gate pad line 116p through the fourth contact hole and the fifth contact hole, respectively.

Although not shown, a partition is formed on the array substrate with the pixel electrode 118 formed thereon. Here, the partition may surround the edges of the pixel electrode 118, like a bank, to define an opening, and is made of an organic insulating material or an inorganic insulating material. The partition may be made of a photosentizer including black pigment, and in this case, the partition serves as a light blocking member.

A white organic light emitting layer is formed on the array substrate 110 with the partition formed thereon.

Here, the organic light emitting layer may have a multi-layer structure including an auxiliary layer for enhancing luminous efficiency of the light emitting layer, in addition to the light emitting layer that emits light. The auxiliary layer includes an electron transport layer and a hole transport layer for balancing electrons and holes and an electron injection layer and a hole injection layer for strengthening injection of electrons and holes, and the like.

A common electrode as a negative electrode is formed on the inorganic light emitting layer. Here, the common electrode receives a common voltage and may be made of a reflective conductive material including calcium (Ca), barium (Ba), magnesium (Mg), aluminum (Al), silver (Ag), and the like, or a transparent conductive material such as ITO, IZO, or the like.

In the W-OLED display device according to the first embodiment of the present invention configured as described above, the second source electrode 122 and the second drain electrode 123 connected to the gate electrode 121 connected to the gate line 116 and the data line form a switching TFT together with the active layer 124. Although not shown, a driving gate electrode connected to the second electrode 123, the driving source electrode connected to a driving voltage line, and the driving drain electrode connected to the pixel electrode 118 constitute a driving TFT together with the driving active layer.

Also, the pixel electrode 118, the organic light emitting layer, and the common electrode may form an organic light emitting diode, and a storage electrode and the driving voltage line that overlap with each other constitute a storage capacitor.

As described above, in the W-OLED display device according to the first embodiment of the present invention, the active layer 124 is formed above the gate electrode 121 and the second source electrode 122 is formed to completely cover the channel region of the active layer 124, thereby blocking light introduced from upper and lower sides of the active layer 124. As a result, reliability of the oxide TFT can be improved.

Also, in the W-OLED display device according to the first embodiment of the present invention, since an etch stopper is deleted while forming the active layer 124 by using an oxide semiconductor, the process is simplified, and since the overcoat layer 115c is formed in the interlayer superposition portion to form a gap, parasitic capacitance can be minimized.

In this case, a high temperature heat treatment is performed in advance during a first masking process to improve reliability of the oxide semiconductor, and copper is applied as a gate wiring during a second masking process to obtain an effect of being applied to a large ultra definition (UD) display device, or the like.

Also, since the etch stopper is deleted and there is no need to additionally apply a mask for a gate contact for connecting the gate electrode of the driving TFT and the second drain electrode 123 of the switching TFT), the process is simplified. This will be described in detail through a method for fabricating a W-OLED display device according to the first embodiment of the present invention.

FIGS. 5A to 5H are cross-sectional views sequentially illustrating a method for fabricating the OLED display device according to the first embodiment of the present invention illustrated in FIG. 4, in which a method for fabricating an array substrate with respect to a single pixel including a pixel part, a data pad part, and a gate pad part is illustrated for the description purpose.

Figure 5A:
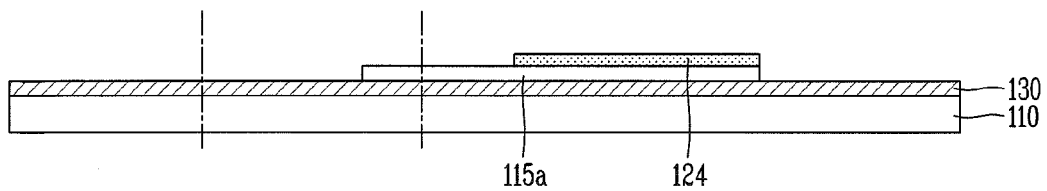
FIGS. 5A to 5H are cross-sectional views sequentially illustrating a method for fabricating the OLED display device according to the first embodiment of the present invention illustrated in FIG. 4.

As illustrated in FIG. 5A, the first conductive layer 130, the gate insulating layer 115a, and the active layer 124 are formed on the array substrate 110 made of an insulating material such as transparent glass, plastic, or the like.

Here, an oxide semiconductor is applied to the TFT according to an embodiment of the present invention is available for a low temperature deposition (or low temperature evaporation), so a substrate applicable to a low temperature process, such as a plastic substrate, soda lime glass, or the like, can be used. Also, since the oxide semiconductor exhibits amorphous characteristics, a substrate for a large display may be used.

The first conductive layer 130, the gate insulating layer 115a, and the active layer 124 are formed by depositing the first conductive layer 130, an insulating layer, and an oxide semiconductor on the entire surface of the array substrate 110 and selectively patterning them through a photolithography process (a first masking process).

In this case, the first masking process may be performed by using a half-tone mask or a slit mask (mentioning of the half-tone mask will also include the slit mask, hereinafter), and this will be described in detail with reference to the accompanying drawings.

FIGS. 6A to 6F are cross-sectional views specifically illustrating a first masking process cording to the first embodiment of the present invention illustrated in FIG. 5A.

Figure 6A:
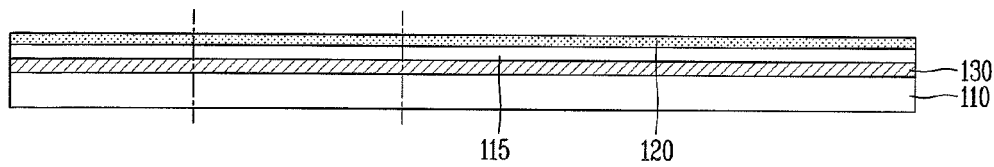
FIGS. 6A to 6F are cross-sectional views specifically illustrating a first masking process cording to the first embodiment of the present invention illustrated in FIG. 5A.

As illustrated in FIG. 6A, the first conductive layer 130, the insulating layer 115, and the semiconductor thin film 120 are deposited sequentially on the array substrate 110 made of an insulating material such as transparent glass, plastic, or the like.

Here, the first conductive layer 130 may be made of a low-resistance opaque conductive material such as molybdenum (Mo), a molybdenum alloy such as molybdenum-titanium (MoTi), chromium (Cr), tantalum (Ta), or titanium (Ti). However, the first conductive layer 130 may have a multi-layer structure including two conductive layers having different physical qualities.

Here, the insulating layer 115 may be formed as an inorganic insulating layer such as a silicon nitride layer or a silicon oxide layer, or a high dielectric oxide layer such as hafnium (Hf) oxide or aluminum oxide and may be formed by using chemical vapor deposition (CVD), plasma enhanced chemical vapor deposition (PECVD), or the like.

An oxide semiconductor including amorphous zinc oxide semiconductor may be used as the semiconductor thin film 120.

Here, the amorphous zinc oxide semiconductor, in particular, a-IGZO semiconductor may be formed according to a sputtering method by using a composite target of a gallium oxide ($Ga_2O_3$), an indium oxide ($In_2O_3$), and a zinc oxide (ZnO), and besides, a chemical deposition method such as CVD or atomic layer deposition (ALD), or the like, may also be used.

As described above, the oxide TFT employing the oxide semiconductor as an active layer has high mobility and can be fabricated at a low temperature, so it may be used in a transparent electronic circuit.

Also, unlike the existing amorphous silicon TFT, the oxide TFT is fabricated to have a structure without an n+ layer, simplifying the process.

In the oxide TFT according to the first embodiment of the present invention, for example, since the active layer is formed by using an amorphous zinc oxide semiconductor, high mobility and constant current test conditions are satisfied, and since uniform characteristics are secured, the oxide TFT can be applied to a large display. In particular, in the oxide TFT according to the first embodiment of the present invention, the active layer may be formed with a-IGZO semiconductor containing heavy metal such as indium and gallium in ZnO.

After the semiconductor thin film 120 formed of a-IGZO semiconductor is deposited, a heat treatment is performed thereon at a temperature of 400° C. or higher in order to improve reliability of the oxide semiconductor.

Figure 6B:
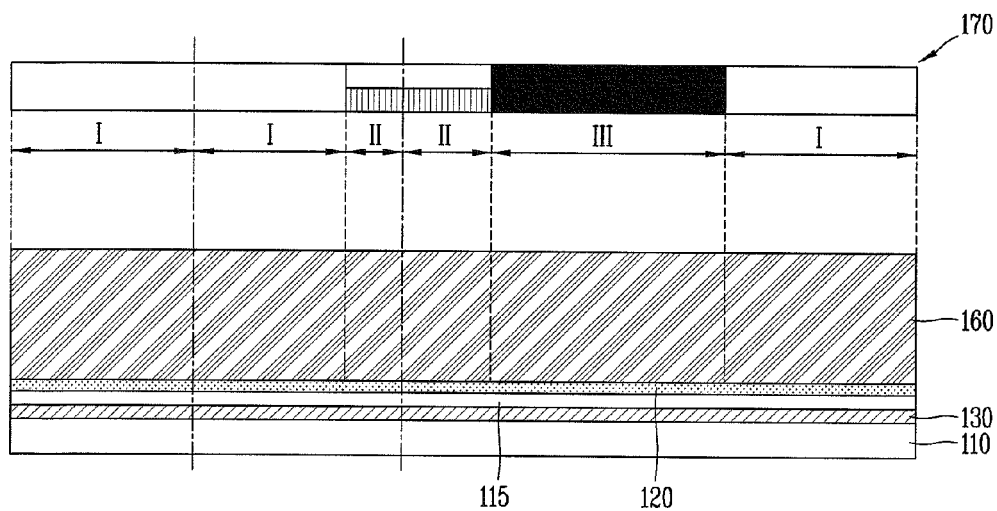

Next, as illustrated in FIG. 6B, a photosensitive layer 160 made of a photosensitive material such as photoresist is formed on the entire surface of the array substrate 110 with the semiconductor thin film 120 deposited thereon, light is selectively irradiated to the photosensitive layer 160 through a half-tone mask 170 according to the first embodiment of the present invention.

Here, the half-tone mask 170 includes a first transmission region I allowing irradiated light to be entirely transmitted therethrough, a second transmission region II allowing only a portion of light to be transmitted therethrough and blocking a portion thereof, and a blocking region III blocking entire irradiated light, and here, only light which has transmitted through the half-tone mask 170 may be irradiated to the photosensitive film 160.

Figure 6C:
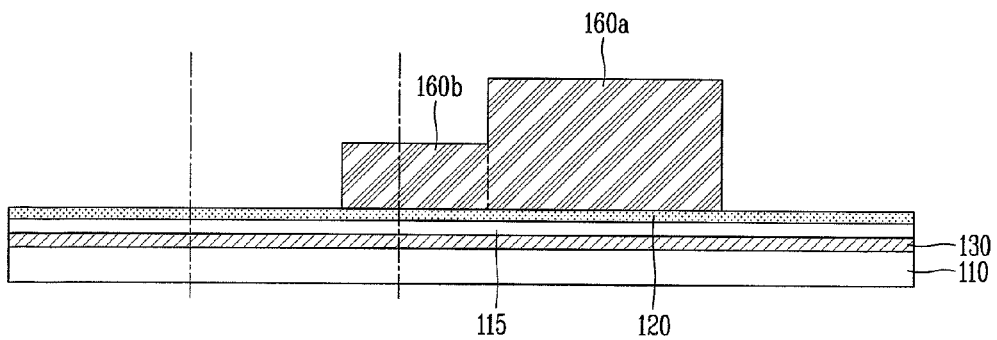

Subsequently, when the photosensitive film 160 which has been exposed through the half-tone mask 180 is developed, as shown in FIG. 6C, first and second photosensitive film patterns 160a and 160b having a certain thickness remain at regions where light was entirely blocked or partially blocked through the blocking region (III) and the second transmission region (II), and the photosensitive film at the transmission region (I) through which light was entirely transmitted has been completely removed to expose the surface of the third conductive film 130.

At this time, the first photosensitive film pattern 160a formed at the blocking region III is thicker than the second photosensitive film pattern 160b formed through the second transmission region II. In addition, the photosensitive film at the region in which the light had entirely transmitted through the first transmission region I was completely removed. This is because positive photoresist was used, but without being limited thereto, negative photoresist may also be used in an embodiment of the present invention.

Figure 6D:
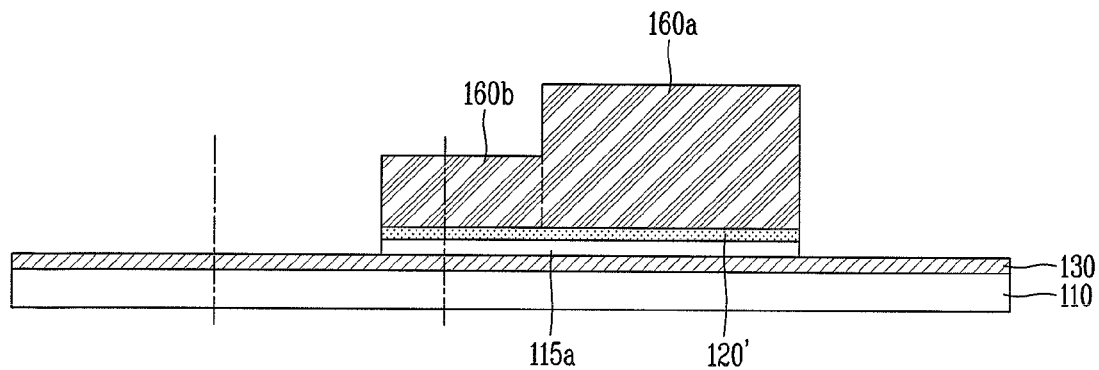

Subsequently, as shown in FIG. 6D, portions of the underlying insulating layer and the semiconductor thin film are selectively removed by using the first and second photosensitive film patterns 160a and 160b as masks to form a semiconductor thin film pattern 120' formed of the oxide semiconductor in a state in which the gate insulating layer 115a is interposed on the first conductive layer 130. At this time, the gate insulating layer 115a formed of the insulating layer is patterned to have the substantially same shape as that of the semiconductor thin film pattern 120'.

Figure 6E:
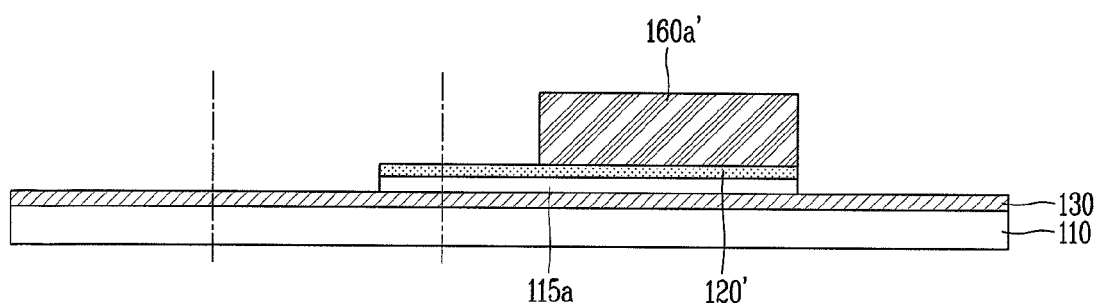

Thereafter, an ashing process is performed to remove portions of the first to fourth and second photosensitive film patterns 160a and 160b. Then, as shown in FIG. 6E, the second photosensitive film pattern at the second transmission region II is completely removed.

In this case, the first photosensitive film pattern remains as a third photosensitive film pattern 160a' with a thickness obtained by removing the thickness of the second photosensitive film pattern only on the region corresponding to the blocking region (III).

Figure 6F:
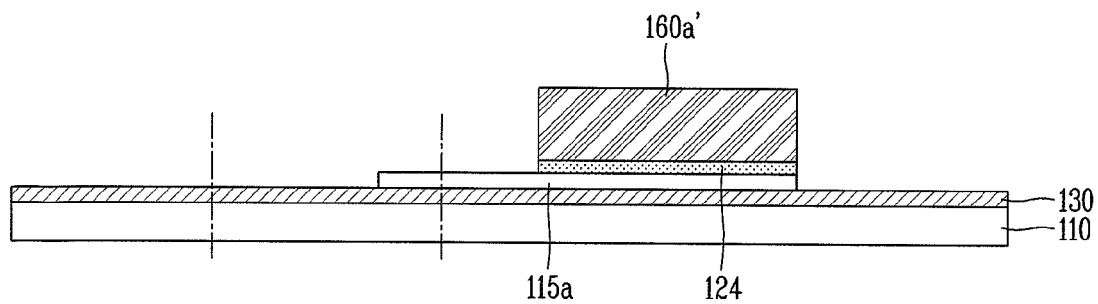

Thereafter, as illustrated in FIG. 6F, when a portion of the underlying semiconductor thin film is selectively removed by using the third photosensitive film pattern 160a' as a mask, the active layer 124 formed of the semiconductor thin film is formed on the gate insulating layer 115a.

Figure 5B:
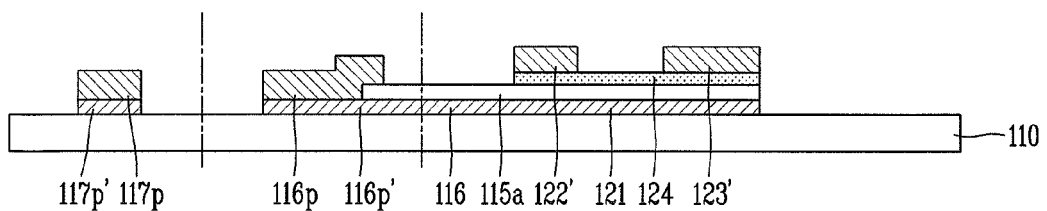

Next, as illustrated in FIG. 5B, after a second conductive layer is deposited on the entire surface of the array substrate 110 with the active layer 124 formed thereon and selectively patterned through a photolithography process (a second masking process) to form the first source and drain electrodes 122' and 123' formed of the second conductive layer on certain regions, i.e., the source and drain regions, of the active layer 124.

Also, the second conductive layer is selectively patterned through the second masking process to form the second data pad line 117p and the second gate pad line 116p formed of the second conductive layer in the pad part of the array substrate 110.

As described above, the second conductive layer may have a tri-layer structure in which MoTi, or the like, is applied as upper and lower barrier layers of a low-resistance conductive material such as copper (Cu), or the like, as a main wiring. However, the present invention is not limited thereto.

Here, the first conductive layer is also selectively patterned through the second masking process, and accordingly, the gate line 116 including the gate electrode 121 formed of the first conductive layer is formed in the pixel part of the array substrate 110 and the first data pad line 117p' and the first gate pad line 116p' formed of the first conductive layer are formed in the pad part of the array substrate 110.

The gate line 116 transfers a gate signal and extends in a horizontal direction. In this case, for a connection with a different layer or an external driving circuit (not shown), the gate line 116 is connected to the first gate pad line 116p', and the gate electrode 121 forms a portion of the gate line 116. When a gate driving circuit generating a gate signal is integrated on the array substrate 110, the gate line 116 may extend to be directly connected to the gate driving circuit.

Here, the active layer 124 is positioned on the gate electrode 121 such that a lower portion thereof is completely covered by the gate electrode 121. The second data pad line 117p and the second gate pad line 116p are positioned on the first data pad line 117p' and the first gate pad line 116p', respectively.

In this manner, in an embodiment of the present invention, a high temperature thermal treatment is performed on the active layer 124 in advance during the first masking process to improve reliability of the oxide TFT, and since the gate wiring (i.e., the second data pad line 117p and the second gate pad line 116p) is made of copper during the second masking process, the oxide TFT can be applied to a large ultra-definition display device, or the like.

Figure 5C:
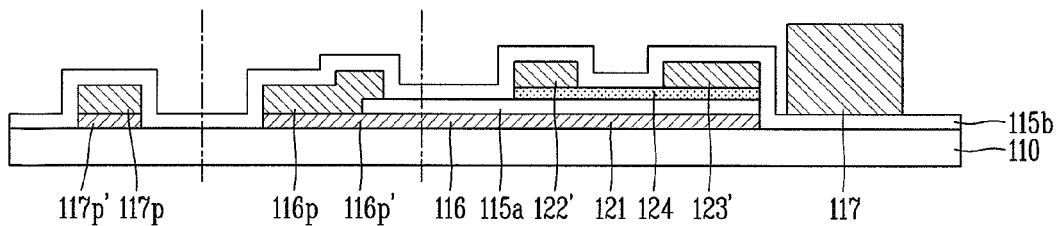

Next, as illustrated in FIG. 5C, the interlayer insulating layer 115b formed of a silicon nitride layer, a silicon oxide layer, or the like, is formed on the first source electrode 122', the first drain electrode 123', the second data pad line 117p, and the second gate pad line 116p.

Also, red, green, and blue color filters 117 are formed on the interlayer insulating layer 115b of the pixel region in which an image is displayed through a photolithography process three times (third masking process to fifth masking process).

Figure 5D:
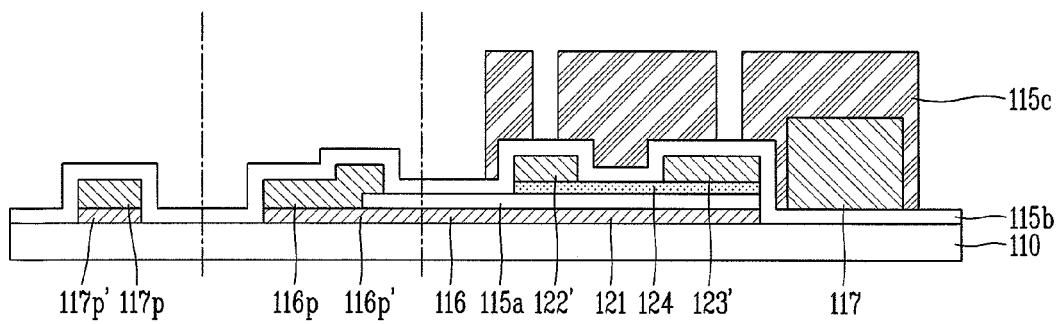

Thereafter, as illustrated in FIG. 5D, the overcoat layer 115c made of photoacryl, or the like, is formed to cover the pixel region in which the color filters 117 are formed and the TFT region through a photolithography process (a sixth masking process).

Figure 5E:
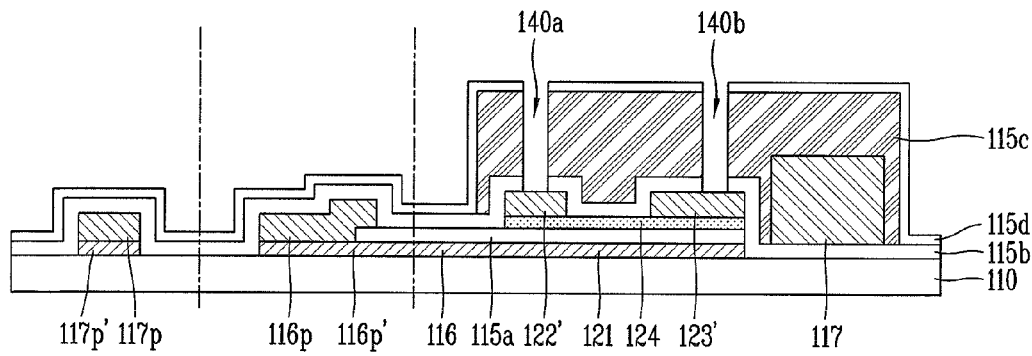

And then, as illustrated in FIG. 5E, the first protective layer 115d formed of a silicon nitride layer, a silicon oxide layer, or the like, is formed on the entire surface of the array substrate 110 with the overcoat layer 115c formed thereon.

Thereafter, the first protective layer 115d is selectively patterned through a photolithography process (a seventh masking process) to form the first contact hole 140a and the second contact hole 140b exposing the first source electrode 122' and the first drain electrode 123', respectively.

Figure 5F:
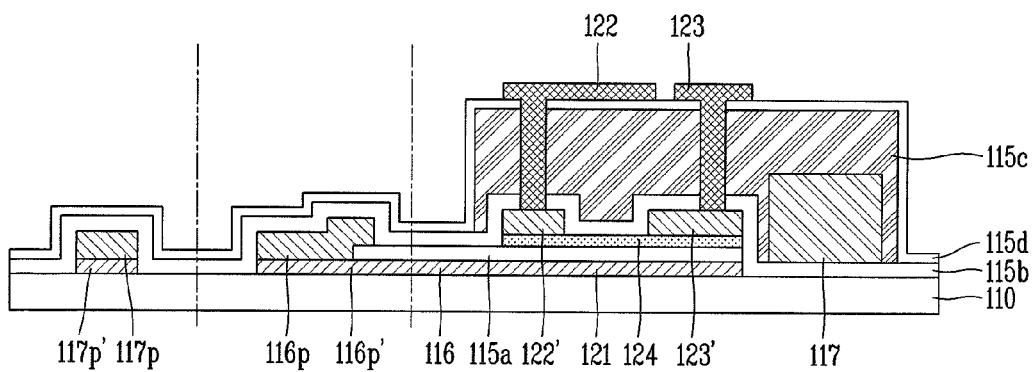

Thereafter, as illustrated in FIG. 5F, a third conductive layer is deposited on the first protective layer 115d and selectively patterned through a photolithography process (an eighth masking process) to form a data line (not shown) formed of the third conductive layer in the pixel part of the array substrate 110 and form the second source electrode 122 and the second drain electrode 123 electrically connected to the first source electrode 122' and the first drain electrode 123' through the first contact hole 140a and the second contact hole 140b, respectively.

Here, since the second source electrode 122 is formed to extend to completely cover the channel region of the active layer 124 from above, it blocks light introduced from upper and lower sides of the active layer 124 together with the lower gate electrode 121, thereby improving reliability of the oxide TFT.

As described above, the data line transfers a data signal and extends in the vertical direction to cross the gate line 116. Here, the data line includes an end portion (not shown) having a large area for a connection between the second source electrode 122 extending toward the gate electrode 121 and a different layer or an external driving circuit (not shown). When a data driving circuit generating a data signal is integrated on the array substrate 110, the data line may extend to be directly connected with the data driving circuit.

At this time, the third conductive layer may be formed to have a dual-layer structure in which MoTi, or the like, is applied as a lower barrier layer of a low-resistance conductive material such as copper (Cu), or the like, as a main wiring. However, the present invention is not limited thereto.

Figure 5G:
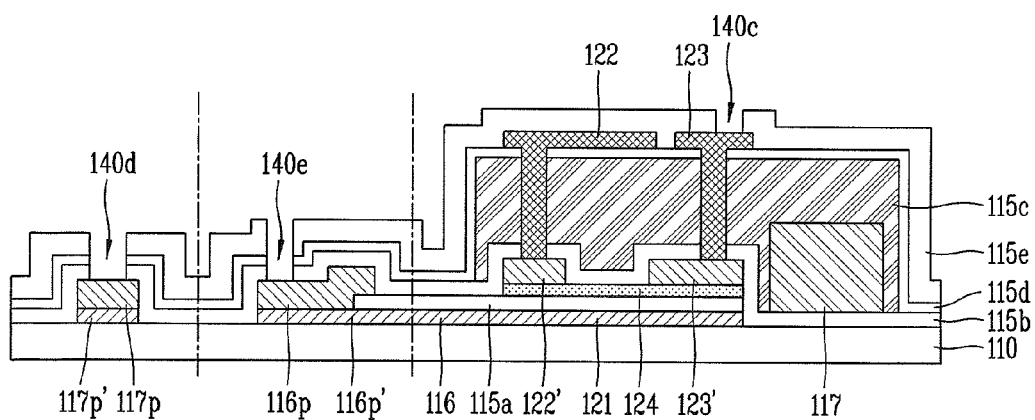

Next, as illustrated in FIG. 5G, a certain second protective layer 115e is formed on the array substrate 110 with the data line, the second source electrode 122, and the second drain electrode 123 formed thereon.

Thereafter, the second protective layer 115e is selectively patterned through a photolithography process (a ninth masking process) to form a third contact hole 140c exposing a portion of the second drain electrode 123 in the pixel part, and the second protective layer 115e, the first protective layer 115d, and the interlayer insulating layer 115b are selectively patterned to form the fourth contact hole 140d and the fifth contact hole 140e exposing portions of the second data pad line 117p and the second gate pad line 116p in the pad part of the array substrate 110.

Figure 5H:
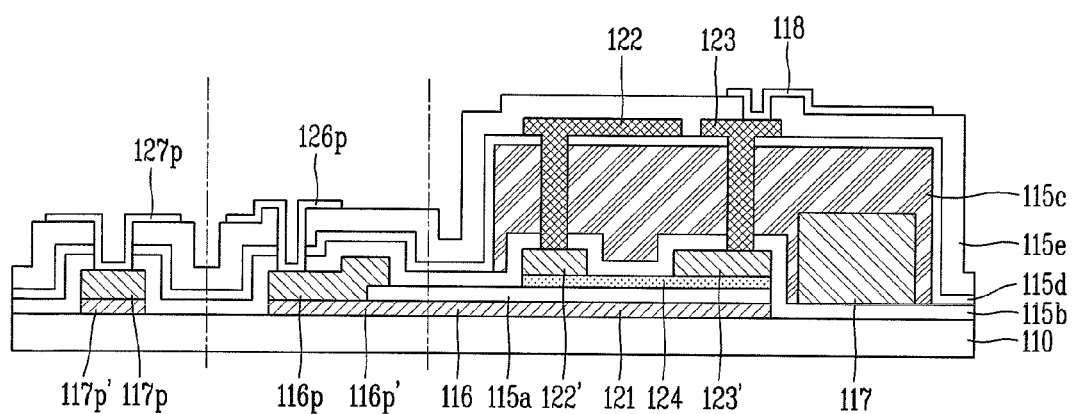

Next, as illustrated in FIG. 5H, a fourth conductive layer is deposited on the entire surface of the array substrate with the second protective layer 115e formed thereon, and selectively patterned through a photolithography process (a tenth masking process) to form the pixel electrode 118 formed of the fourth conductive layer.

At this time, the fourth conductive layer may be made of a transparent conductive material such as ITO, IZO, or the like, or a reflective conductive material such as aluminum, silver, or an alloy thereof, or the like.

Here, the pixel electrode 118 as an anode is electrically connected to the second drain electrode 123 through the third contact hole 140c, and the data pad electrode 127p and the gate pad electrode 126p are electrically connected to the second data pad line 117p and the second gate pad line 116p through the fourth contact hole 140d and the fifth contact hole 140e, respectively.

Also, although not shown, a partition is formed on the array substrate 110 with the pixel electrode 118 formed thereon. Here, the partition surrounds the edges of the pixel electrode 118 to define an opening, and is made of an organic insulating material or an inorganic insulating material. Also, the partition may be made of a photosensitizer including black pigment, and in this case, the partition serves as a light blocking member.

A white organic light emitting layer is formed on the array substrate 110 with the partition formed thereon.

Here, the organic light emitting layer may have a multilayer structure including an auxiliary layer for improving luminous efficiency of the light emitting layer, in addition to the light emitting layer. The auxiliary layer includes an electron transport layer and a hole transport layer for balancing electrons and holes and an electron injection layer and a hole injection layer for strengthening injection of electrons and holes, and the like.

A common electrode as a negative electrode is formed on the inorganic light emitting layer. Here, the common electrode receives a common voltage and may be made of a reflective conductive material including calcium (Ca), barium (Ba), magnesium (Mg), aluminum (Al), silver (Ag), and the like, or a transparent conductive material such as ITO, IZO, or the like.

In the case of the present invention, since the second source electrode 122 is formed to extend to completely cover the channel region of the active layer 124 from above, it can block light introduced from upper and lower sides of the active layer 124 together with the lower gate electrode 121, thus improving reliability of the oxide TFT. Also, the second source electrode 122 serves to prevent moisture ($H_2O$) or hydrogen ($H_2$) from being introduced into the active layer 124 from the outside.

Meanwhile, the data pad line may be formed of the third conductive layer constituting the data wiring (i.e., the second source electrode, the second drain electrode, and the data line).

Also, since the color filters are formed to extend to the TFT region, an overcoat layer may be eliminated, and this will be described in detail through a second embodiment of the present invention.

Figure 7:
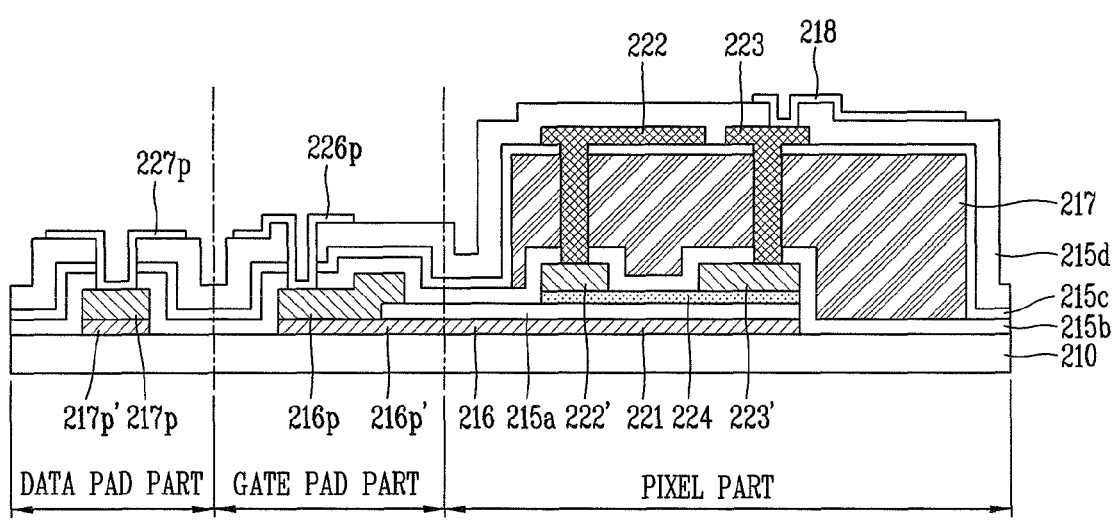
FIG. 7 is a cross-sectional view schematically illustrating a structure of an OLED display device according to a second embodiment of the present invention.

FIG. 7 is a cross-sectional view schematically illustrating a structure of an OLED display device according to a second embodiment of the present invention, in which a white organic light emitting diode (W-OLED) display device having a color filter on TFT (COT) structure in which color filters are formed on a lower array substrate is illustrated as an example.

Here, a single pixel including a pixel part, a data pad part, and a gate pad part is illustrated in the drawing, and N number of gate lines and M number of data lines cross to form M×N number of pixels in an actual OLED device, but for the description purpose, a single pixel is illustrated in the drawings.

As illustrated, in the W-OLED display device according to the second embodiment of the present invention, a gate line 216 including a gate electrode 221, a first data pad line 217p', and a first gate pad line 216p' are formed on an array substrate 210 made of an insulating material such as transparent glass, plastic, or the like.

As described above, the gate line 216 extends in a horizontal direction and transfers a gate signal. Here, the gate line 216 is connected to the first gate pad line 216p' for a connection to a different layer or an external driving circuit (not shown), and the gate electrode 221 may form a portion of the gate line 216. When a gate driving circuit generating a gate signal is integrated on the array substrate 210, the gate line 216 may extend to be directly connected to the gate driving circuit.

A gate insulating layer 215a formed of a silicon nitride layer SiNx, a silicon oxide layer $SiO_2$, or the like, is formed on the gate line 216 including the gate electrode 221 and the predetermined first gate pad line 216p'.

An active layer 224 formed of an oxide semiconductor is formed on the gate insulating layer 215a, and in this case, the active layer 224 is positioned on the gate electrode 221 such that a lower portion thereof is completely covered by the gate electrode 221.

Here, like the first embodiment of the present invention as described above, in the second embodiment of the present invention, for example, the active layer 224 is formed of the oxide semiconductor, but the present invention is not limited thereto and the active layer 224 may be formed of hydrogenated amorphous silicon or polycrystalline silicon.

Also, the oxide TFT employing the oxide semiconductor as the active layer 224 has high mobility and can be fabricated at a low temperature, thus advantageously being used in a transparent electronic circuit.

Also, unlike the existing amorphous silicon TFT, the oxide TFT is fabricated to have a structure without an n+ layer, advantageously simplifying the process.

For example, in the oxide TFT according to the second embodiment of the present invention, since the active layer 224 is formed by using a ZnO semiconductor, high mobility and constant current test conditions are satisfied and uniform characteristics are secured to be applicable to a large display.

In particular, in the oxide TFT according to the second embodiment of the present invention, the active layer is formed of an a-IGZO containing heavy metal such as indium (In) and gallium (Ga) in the ZnO.

A first source electrode 222' and a first drain electrode 223' are formed on a source region and a drain region of the active layer 224, respectively, and a second data pad line 217p and a second gate pad line 216p are formed on the first data pad line 217p' and the first gate pad line 216p', respectively.

Here, the first source electrode 222', the first drain electrode 223', the second data pad line 217p, and the second gate pad line 216p may use a low-resistance conductive material such as copper (Cu), or the like, as a main wiring, and in this case, they may be formed to have a tri-layer structure employing a molybdenum-titanium (MoTi), or the like, as a barrier layer to upper and lower portions thereof. However, the present invention is not limited thereto.

An interlayer insulating layer 215b formed of a silicon nitride layer, a silicon oxide layer, or the like, is formed on the first source electrode 222', the first drain electrode 223', the second data pad line 217p, and the second gate pad line 216p.

Here, unlike the first embodiment of the present invention, in the W-OLED display device according to the second embodiment of the present invention, red, green, and blue color filters 217 are formed to cover the TFT region as well as the pixel region in which an image is displayed.

A first protective layer 215c formed of a silicon nitride layer, a silicon oxide layer, or the like, is formed on the entire surface of the array substrate 210 on which the color filter 217 is formed.

In this case, certain regions of the first protective layer 215c are removed to form a first contact hole and a second contact hole exposing portions of the first source electrode 222' and the first drain electrode 223'.

A data line (not shown) is formed on the first protective layer 215c, and a second source electrode 222 and a second drain electrode 223 electrically connected to the first source electrode 222' and the first drain electrode 223' through the first contact hole and the second contact hole, respectively, are formed on the first protective layer 215c.

Here, the second source electrode 222 is formed to extend to completely cover a channel region of the active layer 224 from above, blocking light introduced from upper and lower portions of the active layer 224 together with the lower gate electrode 221, to improve reliability of the oxide TFT.

The data line transfers a data signal and extends in a vertical direction to cross the gate line 216. Here, the data line includes an end portion (not shown) having a large area for a connection between the second source electrode 222 extending toward the gate electrode 221 and a different layer or an external driving circuit (not shown). When a data driving circuit generating a data signal is integrated on the array substrate 210, the data line may extend to be directly connected to the data driving circuit.

Here, the data line, the second source electrode 222, and the second drain electrode 223 may use a low-resistance conductive material such as copper (Cu), or the like, as a main wiring, and in this case, the data line, the second source electrode 222, and the second drain electrode 223 may be formed to have a dual-layer structure employing MoTi, or the like, as a barrier layer thereunder. However, the present invention is not limited thereto.

A certain second protective layer 215d is formed on the array substrate 210 with the data line, the second source electrode 222, and the second drain electrode 223 formed thereon.

Here, a third contact hole exposing a portion of the second drain electrode 223 is formed in the second protective layer 215d of the pixel part, and a fourth contact hole and a fifth contact hole exposing portions of the second data pad line 217p and the second gate pad line 216p, respectively, may be formed in the second protective layer 215d, the first protective layer 215c, and the interlayer insulating layer 215b of the pad part.

A pixel electrode 218, a data pad electrode 227p, and a gate pad electrode 226p are formed on the second protective layer 215e. The pixel electrode 218, the data pad electrode 227p, and the gate pad electrode 226p may be made of a transparent conductive material such as indium tin oxide (ITO), indium zinc oxide (IZO), or the like, or a reflective conductive material such as aluminum, silver, or an alloy thereof, or the like.

Here, the pixel electrode 218 as a positive electrode is electrically connected to the second drain electrode 223 through the third contact hole, and the data pad electrode 227p and the gate pad electrode 226p are electrically connected to the second data pad line 217p and the second gate pad line 216p through the fourth contact hole and the fifth contact hole, respectively.

Although not shown, a partition is formed on the array substrate with the pixel electrode 218 formed thereon.

A white organic light emitting layer is formed on the array substrate 210 with the partition formed thereon.

A common electrode as a negative electrode is formed on the inorganic light emitting layer. Here, the common electrode receives a common voltage and may be made of a reflective conductive material including calcium (Ca), barium (Ba), magnesium (Mg), aluminum (Al), silver (Ag), and the like, or a transparent conductive material such as ITO, IZO, or the like.

In the W-OLED display device according to the second embodiment of the present invention configured as described above, the second source electrode 222 and the second drain electrode 223 connected to the gate electrode 221 connected to the gate line 216 and the data line form a switching TFT together with the active layer 224. Although not shown, a driving gate electrode connected to the second electrode 223, the driving source electrode connected to a driving voltage line, and the driving drain electrode connected to the pixel electrode 218 constitute a driving TFT together with the driving active layer.

Also, the pixel electrode 218, the organic light emitting layer, and the common electrode may form an organic light emitting diode, and a storage electrode and the driving voltage line that overlap with each other constitute a storage capacitor.

As described above, in the W-OLED display device according to the second embodiment of the present invention, the active layer 224 is formed above the gate electrode 221 and the second source electrode 222 is formed to completely cover the channel region of the active layer 224, thereby blocking light introduced from upper and lower sides of the active layer 224. As a result, reliability of the oxide TFT can be improved.

Also, in the W-OLED display device according to the second embodiment of the present invention, since an etch stopper is deleted while forming the active layer 224 by using an oxide semiconductor, the process is simplified, and since the overcoat layer, i.e., the first protective layer 215c is formed in the interlayer superposition portion to form a gap, parasitic capacitance can be minimized.

In this case, a high temperature heat treatment is performed in advance during a first masking process to improve reliability of the oxide semiconductor, and copper is applied as a gate wiring during a second masking process to obtain an effect of being applied to a large ultra definition (UD) display device, or the like.

Also, since the etch stopper is deleted and there is no need to additionally apply a mask for a gate contact for connecting the gate electrode of the driving TFT and the second drain electrode 223 of the switching TFT), the process is simplified by omitting an overcoat layer. This will be described in detail through a method for fabricating a W-OLED display device according to the second embodiment of the present invention.

FIGS. 8A to 8G are cross-sectional views sequentially illustrating a method for fabricating the OLED display device according to the second embodiment of the present invention illustrated in FIG. 7, in which a method for fabricating an array substrate with respect to a single pixel including a pixel part, a data pad part, and a gate pad part is illustrated for the description purpose.

Figure 8A:
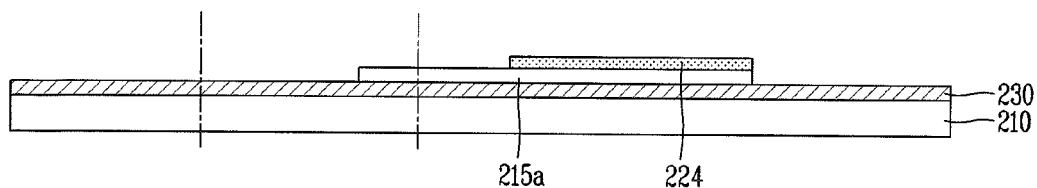
FIGS. 8A to 8G are cross-sectional views sequentially illustrating a method for fabricating the OLED display device according to the second embodiment of the present invention illustrated in FIG. 7.

As illustrated in FIG. 8A, the first conductive layer 230, the gate insulating layer 215a, and the active layer 224 are formed on the array substrate 210 made of an insulating material such as transparent glass, plastic, or the like.

Here, an oxide semiconductor is applied to the TFT according to an embodiment of the present invention is available for a low temperature deposition (or low temperature evaporation), so a substrate applicable to a low temperature process, such as a plastic substrate, soda lime glass, or the like, can be used. Also, since the oxide semiconductor exhibits amorphous characteristics, a substrate for a large display may be used.

The first conductive layer 230, the gate insulating layer 215a, and the active layer 224 are formed by depositing the first conductive layer 230, an insulating layer, and an oxide semiconductor on the entire surface of the array substrate 210 and selectively patterning them through a photolithography process (a first masking process).

In this case, the first masking process may be performed by using a half-tone mask in the same manner as that of the first embodiment described above.

Here, the first conductive layer 230 may be made of a low-resistance opaque conductive material such as molybdenum (Mo), a molybdenum alloy such as molybdenum-titanium (MoTi), chromium (Cr), tantalum (Ta), or titanium (Ti). However, the first conductive layer 230 may have a multi-layer structure including two conductive layers having different physical qualities.

Here, the insulating layer 215 may be formed as an inorganic insulating layer such as a silicon nitride layer or a silicon oxide layer, or a high dielectric oxide layer such as hafnium (Hf) oxide or aluminum oxide.

An oxide semiconductor including ZnO semiconductor may be used as the semiconductor thin film 220.

In the oxide TFT according to the second embodiment of the present invention, for example, since the active layer is formed by using ZnO semiconductor, high mobility and constant current test conditions are satisfied, and since uniform characteristics are secured, the oxide TFT can be applied to a large display. In particular, in the oxide TFT according to the second embodiment of the present invention, the active layer may be formed with a-IGZO semiconductor containing heavy metal such as indium and gallium in ZnO.

After the semiconductor thin film 220 formed of a-IGZO semiconductor is deposited, a heat treatment is performed thereon at a temperature of 400° C. or higher in order to improve reliability of the oxide semiconductor.

Figure 8B:
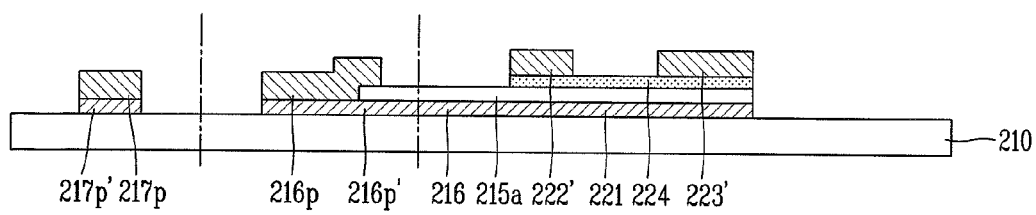

Next, as illustrated in FIG. 8B, after a second conductive layer is deposited on the entire surface of the array substrate 210 with the active layer 224 formed thereon and selectively patterned through a photolithography process (a second masking process) to form the first source and drain electrodes 222' and 223' formed of the second conductive layer on certain regions, i.e., the source and drain regions, of the active layer 224.

Also, the second conductive layer is selectively patterned through the second masking process to form the second data pad line 217p and the second gate pad line 216p formed of the second conductive layer in the pad part of the array substrate 210.

As described above, the second conductive layer may have a tri-layer structure in which MoTi, or the like, is applied as upper and lower barrier layers of a low-resistance conductive material such as copper (Cu), or the like, as a main wiring. However, the present invention is not limited thereto.

Here, the first conductive layer is also selectively patterned through the second masking process, and accordingly, the gate line 216 including the gate electrode 221 formed of the first conductive layer is formed in the pixel part of the array substrate 210 and the first data pad line 217p' and the first gate pad line 216p' formed of the first conductive layer are formed in the pad part of the array substrate 210.

As described above, the gate line 216 transfers a gate signal and extends in a horizontal direction. In this case, for a connection with a different layer or an external driving circuit (not shown), the gate line 216 is connected to the first gate pad line 216p', and the gate electrode 221 forms a portion of the gate line 216. When a gate driving circuit generating a gate signal is integrated on the array substrate 210, the gate line 216 may extend to be directly connected to the gate driving circuit.

Here, the active layer 224 is positioned on the gate electrode 221 such that a lower portion thereof is completely covered by the gate electrode 221. The second data pad line 217p and the second gate pad line 216p are positioned on the first data pad line 217p' and the first gate pad line 216p', respectively.

In this manner, in an embodiment of the present invention, a high temperature thermal treatment is performed on the active layer 224 in advance during the first masking process to improve reliability of the oxide TFT, and since the gate wiring (i.e., the second data pad line 217p and the second gate pad line 216p) is made of copper during the second masking process, the oxide TFT can be applied to a large ultra-definition display device, or the like.

Figure 8C:
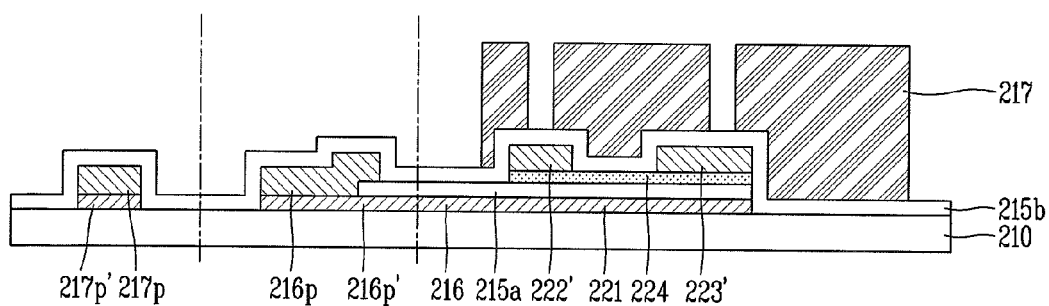

Next, as illustrated in FIG. 8C, the interlayer insulating layer 215b formed of a silicon nitride layer, a silicon oxide layer, or the like, is formed on the first source electrode 222', the first drain electrode 223', the second data pad line 217p, and the second gate pad line 216p.

Also, red, green, and blue color filters 217 are formed on the interlayer insulating layer 215b of the pixel region in which an image is displayed through a photolithography process three times (third masking process to fifth masking process).

Figure 8D:
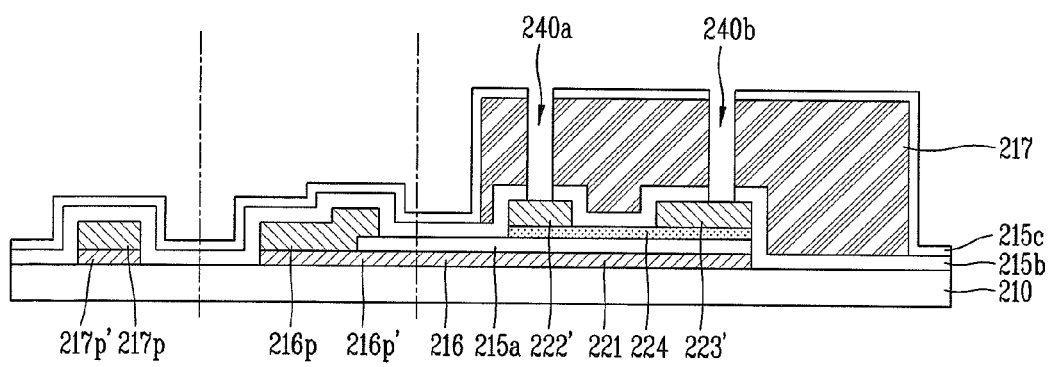

As illustrated in FIG. 8D, the first protective layer 215c formed of a silicon nitride layer, a silicon oxide layer, or the like, is formed on the entire surface of the array substrate 210 with the color filters 217 formed thereon.

Thereafter, the first protective layer 215c is selectively patterned through a photolithography process (a sixth masking process) to form the first contact hole 240a and the second contact hole 240b exposing the first source electrode 222' and the first drain electrode 223', respectively.

Figure 8E:
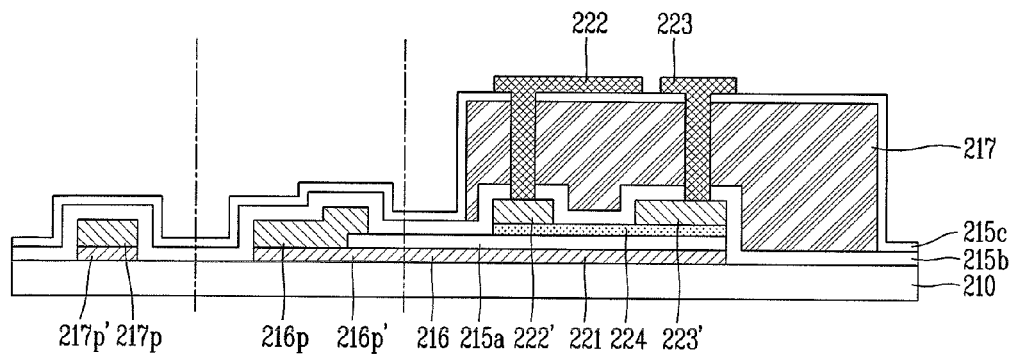

Thereafter, as illustrated in FIG. 8E, a third conductive layer is deposited on the first protective layer 215c and selectively patterned through a photolithography process (a seventh masking process) to form a data line (not shown) formed of the third conductive layer in the pixel part of the array substrate 210 and form the second source electrode 222 and the second drain electrode 223 electrically connected to the first source electrode 222' and the first drain electrode 223' through the first contact hole 240a and the second contact hole 240b, respectively.

Here, since the second source electrode 222 is formed to extend to completely cover the channel region of the active layer 224 from above, it blocks light introduced from upper and lower sides of the active layer 224 together with the lower gate electrode 221, thereby improving reliability of the oxide TFT.

As described above, the data line transfers a data signal and extends in the vertical direction to cross the gate line 216. Here, the data line includes an end portion (not shown) having a large area for a connection between the second source electrode 222 extending toward the gate electrode 221 and a different layer or an external driving circuit (not shown). When a data driving circuit generating a data signal is integrated on the array substrate 210, the data line may extend to be directly connected with the data driving circuit.

At this time, the third conductive layer may be formed to have a dual-layer structure in which MoTi, or the like, is applied as a lower barrier layer of a low-resistance conductive material such as copper (Cu), or the like, as a main wiring. However, the present invention is not limited thereto.

Figure 8F:
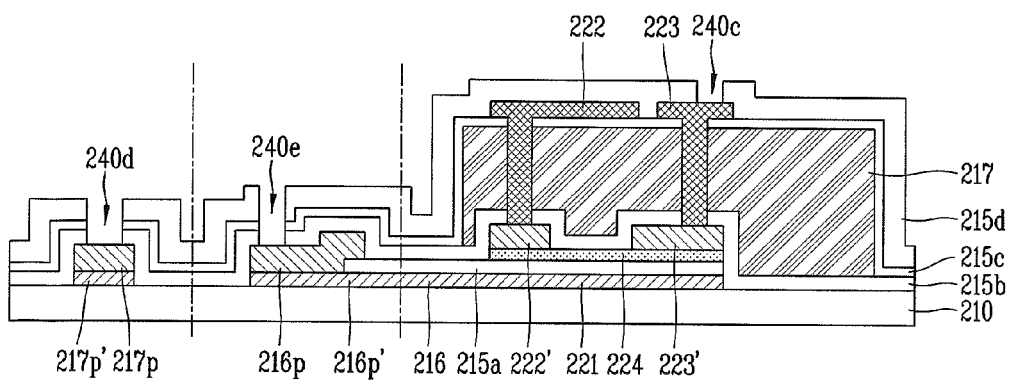

Next, as illustrated in FIG. 8F, a certain second protective layer 215e is formed on the array substrate 210 with the data line, the second source electrode 222, and the second drain electrode 223 formed thereon.

Thereafter, the second protective layer 215d is selectively patterned through a photolithography process (a ninth masking process) to form a third contact hole 240c exposing a portion of the second drain electrode 223 in the pixel part, and the second protective layer 215d, the first protective layer 215c, and the interlayer insulating layer 215b are selectively patterned to form the fourth contact hole 240d and the fifth contact hole 240e exposing portions of the second data pad line 217p and the second gate pad line 216p in the pad part of the array substrate 210.

Figure 8G:
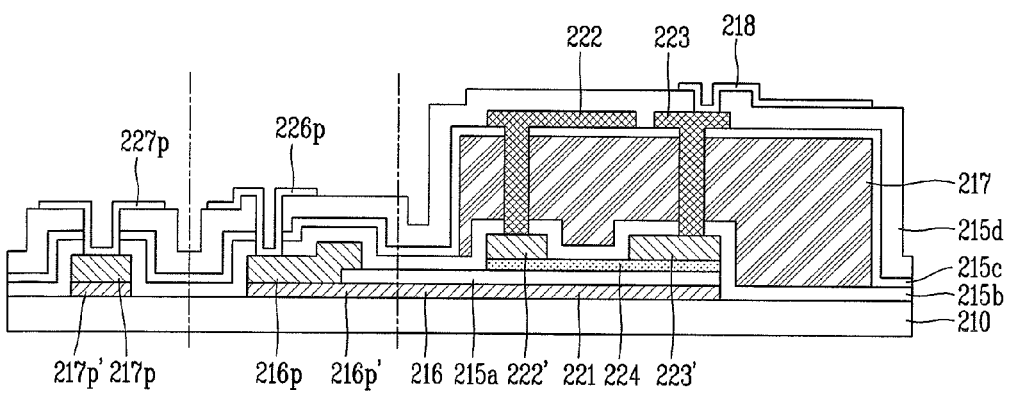

Next, as illustrated in FIG. 8G, a fourth conductive layer is deposited on the entire surface of the array substrate with the second protective layer 215d formed thereon, and selectively patterned through a photolithography process (a tenth masking process) to form the pixel electrode 218 formed of the fourth conductive layer.

At this time, the fourth conductive layer may be made of a transparent conductive material such as ITO, IZO, or the like, or a reflective conductive material such as aluminum, silver, or an alloy thereof, or the like.

Here, the pixel electrode 218 as an anode is electrically connected to the second drain electrode 223 through the third contact hole 240c, and the data pad electrode 227p and the gate pad electrode 226p are electrically connected to the second data pad line 217p and the second gate pad line 216p through the fourth contact hole 240d and the fifth contact hole 240e, respectively.

Also, although not shown, a partition is formed on the array substrate 210 with the pixel electrode 218 formed thereon.

A white organic light emitting layer is formed on the array substrate 210 with the partition formed thereon.

A common electrode as a negative electrode is formed on the inorganic light emitting layer. Here, the common electrode receives a common voltage and may be made of a reflective conductive material including calcium (Ca), barium (Ba), magnesium (Mg), aluminum (Al), silver (Ag), and the like, or a transparent conductive material such as ITO, IZO, or the like.

In the case of the present invention, since the second source electrode 222 is formed to extend to completely cover the channel region of the active layer 224 from above, it can block light introduced from upper and lower sides of the active layer 224 together with the lower gate electrode 221, thus improving reliability of the oxide TFT. Also, the second source electrode 222 serves to prevent moisture ($H_2O$) or hydrogen ($H_2$) from being introduced into the active layer 224 from the outside.

Meanwhile, as mentioned above, the data pad line may be formed of the third conductive layer constituting the data wiring (i.e., the second source electrode, the second drain electrode, and the data line), and this will be described in detail through a third embodiment of the present invention.

Figure 9:
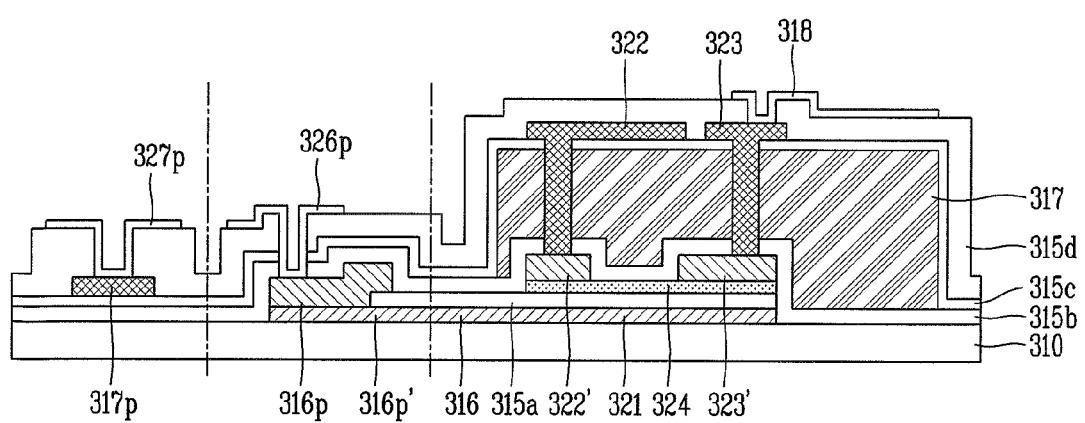
FIG. 9 is a cross-sectional view schematically illustrating a structure of an OLED display device according to a third embodiment of the present invention.

FIG. 9 is a cross-sectional view schematically illustrating a structure of an OLED display device according to a third embodiment of the present invention, in which a white organic light emitting diode (W-OLED) display device having a color filter on TFT (COT) structure in which color filters are formed on a lower array substrate is illustrated as an example.

Here, a single pixel including a pixel part, a data pad part, and a gate pad part is illustrated in the drawing, and N number of gate lines and M number of data lines cross to form M×N number of pixels in an actual OLED device, but for the description purpose, a single pixel is illustrated in the drawings.

As illustrated, in the W-OLED display device according to the third embodiment of the present invention, a gate line 316 including a gate electrode 321, and a first gate pad line 316p' are formed on an array substrate 310 made of an insulating material such as transparent glass, plastic, or the like.

A gate insulating layer 315a formed of a silicon nitride layer SiNx, a silicon oxide layer $SiO_2$, or the like, is formed on the gate line 316 including the gate electrode 321 and the predetermined first gate pad line 316p'.

An active layer 324 formed of an oxide semiconductor is formed on the gate insulating layer 315a, and in this case, the active layer 324 is positioned on the gate electrode 321 such that a lower portion thereof is completely covered by the gate electrode 321.

Here, like the first and second embodiments of the present invention as described above, in the third embodiment of the present invention, for example, the active layer 324 is formed of the oxide semiconductor, but the present invention is not limited thereto and the active layer 324 may be formed of hydrogenated amorphous silicon or polycrystalline silicon.

For example, in the oxide TFT according to the third embodiment of the present invention, since the active layer 324 is formed by using an (ZnO) semiconductor, high mobility and constant current test conditions are satisfied and uniform characteristics are secured to be applicable to a large display.

In particular, in the oxide TFT according to the third embodiment of the present invention, the active layer is formed of an a-IGZO containing heavy metal such as indium (In) and gallium (Ga) in the ZnO.

A first source electrode 322' and a first drain electrode 323' are formed on a source region and a drain region of the active layer 324, respectively, and a second gate pad line 316p is formed on the first gate pad line 316p'.

Here, the first source electrode 322', the first drain electrode 323', and the second gate pad line 316p may use a low-resistance conductive material such as copper (Cu), or the like, as a main wiring, and in this case, they may be formed to have a tri-layer structure employing a molybdenum-titanium (MoTi), or the like, as a barrier layer to upper and lower portions thereof. However, the present invention is not limited thereto.

An interlayer insulating layer 315b formed of a silicon nitride layer, a silicon oxide layer, or the like, is formed on the first source electrode 322', the first drain electrode 323', and the second gate pad line 316p.

Here, unlike the first embodiment of the present invention, in the W-OLED display device according to the third embodiment of the present invention, red, green, and blue color filters 317 are formed to cover the TFT region as well as the pixel region in which an image is displayed.

A first protective layer 315c formed of a silicon nitride layer, a silicon oxide layer, or the like, is formed on the entire surface of the array substrate 310 on which the color filter 317 is formed.

In this case, certain regions of the first protective layer 315c are removed to form a first contact hole and a second contact hole exposing portions of the first source electrode 322' and the first drain electrode 323'.

A data line (not shown) is formed on the first protective layer 315c, and a second source electrode 322 and a second drain electrode 323 electrically connected to the first source electrode 322' and the first drain electrode 323' through the first contact hole and the second contact hole, respectively, are formed on the first protective layer 315c. Here, in the case of the third embodiment of the present invention, unlike the first and second embodiments of the present invention, the data pad line 317p formed of the drain wiring (i.e., the data line, the second source electrode 322, and the second drain electrode 323) is formed in the data pad part.

Here, the second source electrode 322 is formed to extend to completely cover a channel region of the active layer 324 from above, blocking light introduced from upper and lower portions of the active layer 324 together with the lower gate electrode 321, to improve reliability of the oxide TFT.

Here, the data line, the second source and drain electrodes 322 and 323, and the data pad line 317p may use a low-resistance conductive material such as copper (Cu), or the like, as a main wiring, and in this case, the data line, the second source electrode 322, and the second drain electrode 323 may be formed to have a dual-layer structure employing MoTi, or the like, as a barrier layer thereunder. However, the present invention is not limited thereto.

A certain second protective layer 315d is formed on the array substrate 310 with the data line, the second source and drain electrodes 322 and 323, and the data pad line 317p formed thereon.

Here, a third contact hole exposing a portion of the second drain electrode 323 is formed in the second protective layer 315d of the pixel part, and a fourth contact hole and a fifth contact hole exposing portions of the second data pad line 317p and the second gate pad line 316p, respectively, may be formed in the second protective layer 315d, the first protective layer 315c, and the interlayer insulating layer 315b of the pad part.

A pixel electrode 318, a data pad electrode 327p, and a gate pad electrode 326p are formed on the second protective layer 315e. The pixel electrode 318, the data pad electrode 327p, and the gate pad electrode 326p may be made of a transparent conductive material such as indium tin oxide (ITO), indium zinc oxide (IZO), or the like, or a reflective conductive material such as aluminum, silver, or an alloy thereof, or the like.

Here, the pixel electrode 318 as a positive electrode is electrically connected to the second drain electrode 323 through the third contact hole, and the data pad electrode 327p and the gate pad electrode 326p are electrically connected to the second data pad line 317p and the second gate pad line 316p through the fourth contact hole and the fifth contact hole, respectively.

Although not shown, a partition is formed on the array substrate 310 with the pixel electrode 318 formed thereon.

A white organic light emitting layer is formed on the array substrate 310 with the partition formed thereon.

A common electrode as a negative electrode is formed on the inorganic light emitting layer. Here, the common electrode receives a common voltage and may be made of a reflective conductive material including calcium (Ca), barium (Ba), magnesium (Mg), aluminum (Al), silver (Ag), and the like, or a transparent conductive material such as ITO, IZO, or the like.

A method for fabricating a W-OLED display device according to the third embodiment of the present invention will be described in detail with reference to the accompanying drawings.

FIGS. 10A to 10G are cross-sectional views sequentially illustrating a method for fabricating the OLED display device according to the third embodiment of the present invention illustrated in FIG. 9, in which a method for fabricating an array substrate with respect to a single pixel including a pixel part, a data pad part, and a gate pad part is illustrated for the description purpose.

Figure 10A:
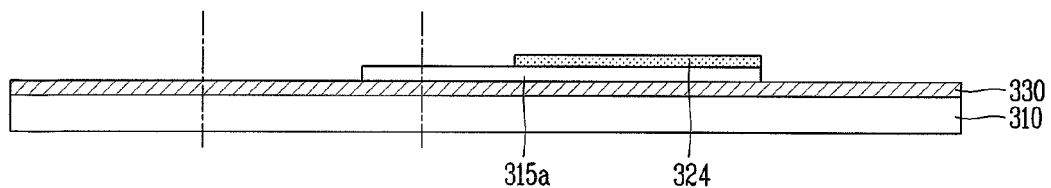
FIGS. 10A to 10G are cross-sectional views sequentially illustrating a method for fabricating the OLED display device according to the third embodiment of the present invention illustrated in FIG. 9.

As illustrated in FIG. 10A, the first conductive layer 330, the gate insulating layer 315a, and the active layer 324 are formed on the array substrate 310 made of an insulating material such as transparent glass, plastic, or the like.

Here, an oxide semiconductor is applied to the TFT according to an embodiment of the present invention is available for a low temperature deposition (or low temperature evaporation), so a substrate applicable to a low temperature process, such as a plastic substrate, soda lime glass, or the like, can be used. Also, since the oxide semiconductor exhibits amorphous characteristics, a substrate for a large display may be used.

The first conductive layer 330, the gate insulating layer 315a, and the active layer 324 are formed by depositing the first conductive layer 330, an insulating layer, and an oxide semiconductor on the entire surface of the array substrate 310 and selectively patterning them through a photolithography process (a first masking process).

In this case, the first masking process may be performed by using a half-tone mask in the same manner as that of the first embodiment described above.

Here, the first conductive layer 330 may be made of a low-resistance opaque conductive material such as molybdenum (Mo), a molybdenum alloy such as molybdenum-titanium (MoTi), chromium (Cr), tantalum (Ta), or titanium (Ti). However, the first conductive layer 330 may have a multi-layer structure including two conductive layers having different physical qualities.

Here, the insulating layer 315 may be formed as an inorganic insulating layer such as a silicon nitride layer or a silicon oxide layer, or a high dielectric oxide layer such as hafnium (Hf) oxide or aluminum oxide.

An oxide semiconductor including ZnO semiconductor may be used as the semiconductor thin film 320.

In the oxide TFT according to the third embodiment of the present invention, for example, since the active layer is formed by using ZnO semiconductor, high mobility and constant current test conditions are satisfied, and since uniform characteristics are secured, the oxide TFT can be applied to a large display. In particular, in the oxide TFT according to the third embodiment of the present invention, the active layer may be formed with a-IGZO semiconductor containing heavy metal such as indium and gallium in ZnO.

After the semiconductor thin film 320 formed of a-IGZO semiconductor is deposited, a heat treatment is performed thereon at a temperature of 400° C. or higher in order to improve reliability of the oxide semiconductor.

Figure 10B:
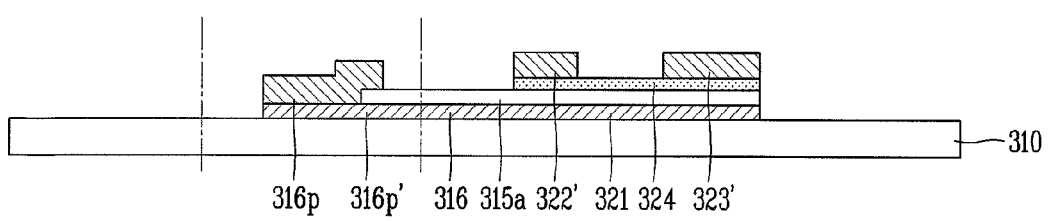

Next, as illustrated in FIG. 10B, after a second conductive layer is deposited on the entire surface of the array substrate 310 with the active layer 324 formed thereon and selectively patterned through a photolithography process (a second masking process) to form the first source and drain electrodes 322' and 323' formed of the second conductive layer on certain regions, i.e., the source and drain regions, of the active layer 324.

Also, the second conductive layer is selectively patterned through the second masking process to form the second gate pad line 316p formed of the second conductive layer in the gate pad part of the array substrate 310.

As described above, the second conductive layer may have a tri-layer structure in which MoTi, or the like, is applied as upper and lower barrier layers of a low-resistance conductive material such as copper (Cu), or the like, as a main wiring. However, the present invention is not limited thereto.

Here, the first conductive layer is also selectively patterned through the second masking process, and accordingly, the gate line 316 including the gate electrode 321 formed of the first conductive layer is formed in the pixel part of the array substrate 310 and the first gate pad line 316p' formed of the first conductive layer is formed in the gate pad part of the array substrate 310.

Here, the active layer 324 is positioned on the gate electrode 321 such that a lower portion thereof is completely covered by the gate electrode 321. The second gate pad line 316p is positioned on the first gate pad line 316p'.

In this manner, in an embodiment of the present invention, a high temperature thermal treatment is performed on the active layer 324 in advance during the first masking process to improve reliability of the oxide TFT, and since the gate wiring (i.e., the second gate pad line 316p) is made of copper during the second masking process, the oxide TFT can be applied to a large ultra-definition display device, or the like.

Figure 10C:
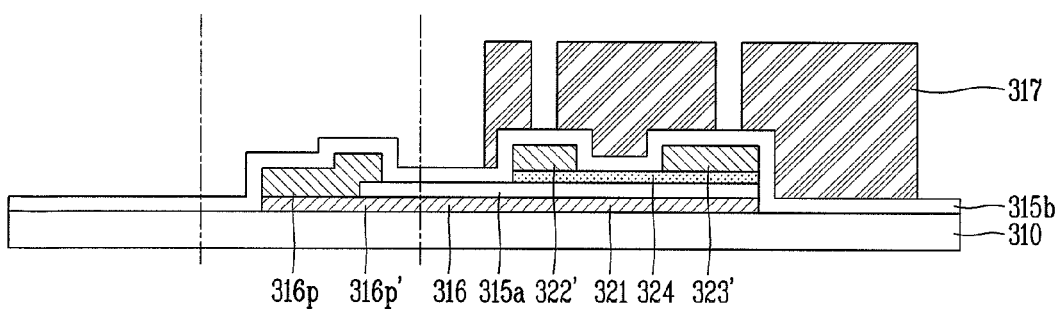

Next, as illustrated in FIG. 10C, the interlayer insulating layer 315b formed of a silicon nitride layer, a silicon oxide layer, or the like, is formed on the first source electrode 322', the first drain electrode 323', and the second gate pad line 316p.

Also, red, green, and blue color filters 317 are formed on the interlayer insulating layer 315b of the pixel region in which an image is displayed through a photolithography process three times (third masking process to fifth masking process).

Figure 10D:
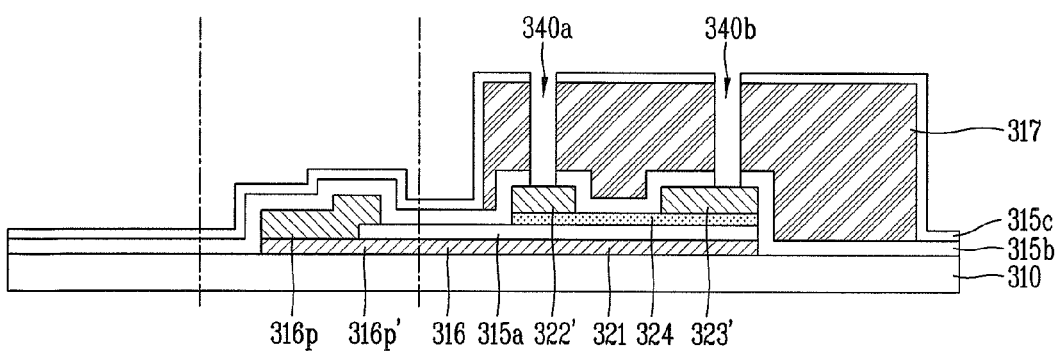

And then, as illustrated in FIG. 10D, the first protective layer 315c formed of a silicon nitride layer, a silicon oxide layer, or the like, is formed on the entire surface of the array substrate 310 with the color filters 317 formed thereon.

Thereafter, the first protective layer 315c is selectively patterned through a photolithography process (a sixth masking process) to form the first contact hole 340a and the second contact hole 340b exposing the first source electrode 322' and the first drain electrode 323', respectively.

Figure 10E:
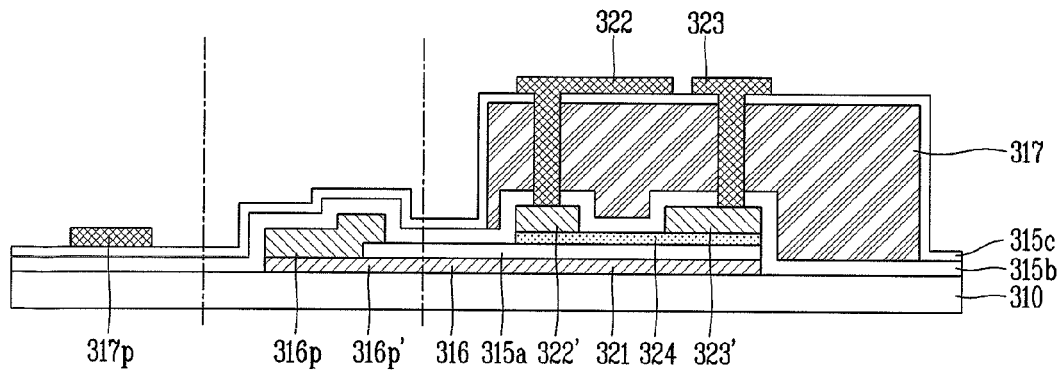

Thereafter, as illustrated in FIG. 10E, a third conductive layer is deposited on the first protective layer 315c and selectively patterned through a photolithography process (a seventh masking process) to form a data line (not shown) formed of the third conductive layer in the pixel part of the array substrate 310 and form the second source electrode 322 and the second drain electrode 323 electrically connected to the first source electrode 322' and the first drain electrode 323' through the first contact hole 340a and the second contact hole 340b, respectively.

Here, in the case of the third embodiment of the present invention, unlike the first and second embodiments of the present invention, the data pad line 317p formed of the drain wiring (i.e., the data line, the second source electrode 322, and the second drain electrode 323) is formed in the data pad part through the seventh masking process.

Here, since the second source electrode 322 is formed to extend to completely cover the channel region of the active layer 324 from above, it blocks light introduced from upper and lower sides of the active layer 324 together with the lower gate electrode 321, thereby improving reliability of the oxide TFT.

At this time, the third conductive layer may be formed to have a dual-layer structure in which MoTi, or the like, is applied as a lower barrier layer of a low-resistance conductive material such as copper (Cu), or the like, as a main wiring. However, the present invention is not limited thereto.

Figure 10F:
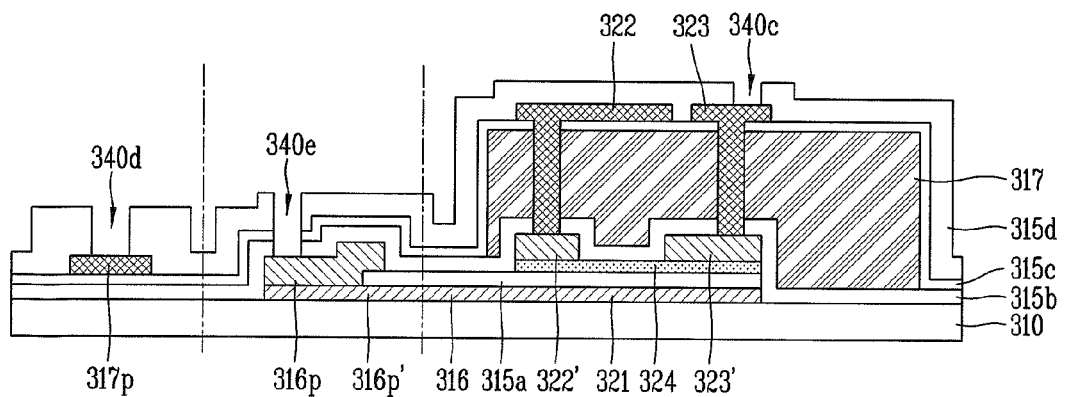

Next, as illustrated in FIG. 10F, a certain second protective layer 315e is formed on the array substrate 310 with the data line, the second source and drain electrodes 322 and 323, and the data pad line 317p formed thereon.

Thereafter, the second protective layer 315d is selectively patterned through a photolithography process (a ninth masking process) to form a third contact hole 340c exposing a portion of the second drain electrode 323 in the pixel part, and the second protective layer 315d, the first protective layer 315c, and the interlayer insulating layer 315b are selectively patterned to form the fourth contact hole 340d and the fifth contact hole 340e exposing portions of the second data pad line 317p and the second gate pad line 316p in the pad part of the array substrate 310.

Figure 10G:
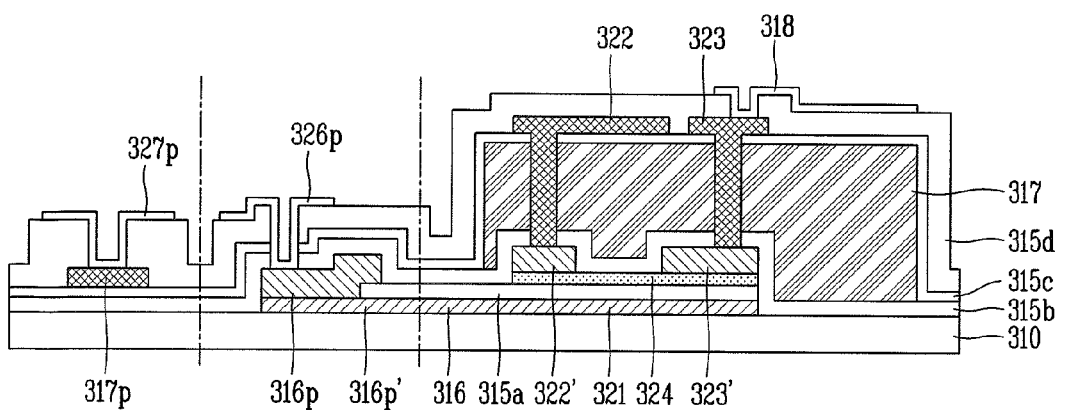

Next, as illustrated in FIG. 10G, a fourth conductive layer is deposited on the entire surface of the array substrate with the second protective layer 315d formed thereon, and selectively patterned through a photolithography process (a tenth masking process) to form the pixel electrode 318 formed of the fourth conductive layer.

At this time, the fourth conductive layer may be made of a transparent conductive material such as ITO, IZO, or the like, or a reflective conductive material such as aluminum, silver, or an alloy thereof, or the like.

Here, the pixel electrode 318 as an anode is electrically connected to the second drain electrode 323 through the third contact hole 340c, and the data pad electrode 327p and the gate pad electrode 326p are electrically connected to the second data pad line 317p and the second gate pad line 316p through the fourth contact hole 340d and the fifth contact hole 340e, respectively.

Also, although not shown, a partition is formed on the array substrate 310 with the pixel electrode 318 formed thereon.

A white organic light emitting layer is formed on the array substrate 310 with the partition formed thereon.

A common electrode as a negative electrode is formed on the inorganic light emitting layer. Here, the common electrode receives a common voltage and may be made of a reflective conductive material including calcium (Ca), barium (Ba), magnesium (Mg), aluminum (Al), silver (Ag), and the like, or a transparent conductive material such as ITO, IZO, or the like.

What is claimed is:

1. A method for fabricating an organic light emitting diode (OLED) display device, the method comprising:
   forming a first conductive layer, a gate insulating layer, and an active layer on an array substrate;
   forming a first source electrode and a first drain electrode formed of a second conductive layer on a source region and a drain region of the active layer, respectively and forming a gate line including a gate electrode formed of the first conductive layer under the active layer;
   forming an interlayer insulating layer on the array substrate with the first source electrode, the first drain electrode, the gate electrode, and the gate line formed thereon through a third masking process;
   forming red, green, and blue color filters on the interlayer insulating layer;
   forming a first protective layer on the array substrate with the color filters formed thereon, the first protective layer having a first contact hole and a second contact hole exposing the first source electrode and the first drain electrode, respectively;
   forming a second source electrode and a second drain electrode electrically connected to the first source electrode and the first drain electrode through the first contact hole and the second contact hole, respectively, the second source electrode and the second drain electrode being formed of a third conductive layer on the first protective layer;
   forming a second protective layer on the array substrate with the second source electrode and the second drain electrode formed thereon, the second protective layer including a third contact hole exposing the second drain electrode;
   forming a pixel electrode electrically connected to the second drain electrode through the third contact hole, the pixel electrode being formed of a fourth conductive layer on the second protective layer;
   forming a partition on the array substrate with the pixel electrode formed thereon;
   forming an organic light emitting layer on the array substrate with the partition formed thereon; and
   forming a common electrode on the organic light emitting layer.

2. The method of claim 1, wherein the first conductive layer, the gate insulating layer, and the active layer are formed through a first masking process.

3. The method of claim 1, wherein the first source electrode, the second drain electrode, the gate electrode, and the gate line are formed through a second masking process.

4. The method of claim 1, wherein when the gate electrode and the gate line are formed, a first data pad line and a first gate pad line formed of the first conductive layer are formed in a pad part of the array substrate.

5. The method of claim 4, wherein when the first source electrode and the first drain electrode are formed, a second data pad line and a second gate pad line, respectively, are formed of the second conductive layer on the first data pad line and the first gate pad line.

6. The method of claim 5, wherein when the second protective layer is formed, the second protective layer, the first protective layer, and the interlayer insulating layer are selectively patterned to form a fourth contact hole and a fifth contact hole, exposing the second data pad line and the second gate pad line, respectively, in the pad part of the array substrate.

7. The method of claim 6, wherein when the pixel electrode is formed, a data pad electrode and a gate pad electrode electrically connected to the second data pad line and the second gate pad line through the fourth contact hole and the fifth contact hole, respectively, are formed in the pad part of the array substrate.

8. The method of claim 1, wherein when the gate electrode and the gate line are formed, a first gate pad line formed of the first conductive layer is formed in a pad part of the array substrate.

9. The method of claim 8, wherein when the first source electrode and the first drain electrode are formed, a second gate pad line formed of the second conductive layer is formed on the first gate pad line.

10. The method of claim 9, wherein when the second source electrode and the second drain electrode are formed, a data pad line formed of the third conductive layer is formed in the pad part of the array substrate.

11. The method of claim 10, wherein when the second protective layer is formed, the second protective layer, the first protective layer, and the interlayer insulating layer are selectively patterned to form a fourth contact hole and a fifth contact hole, exposing the data pad line and the second gate pad line, respectively, in the pad part of the array substrate.

12. The method of claim 11, wherein when the pixel electrode is formed, a data pad electrode and a gate pad electrode electrically connected to the data pad line and the second gate pad line through the fourth contact hole and the fifth contact hole, respectively, are formed in the pad part of the array substrate.

13. The method of claim 1, further comprising:
forming an overcoat layer on the array substrate with the color filters formed thereon, after the color filters are formed.

14. The method of claim 1, wherein the gate electrode is formed to cover a lower portion of the active layer, and the second source electrode is formed to cover a channel region of the active layer.

* * * * *